(12) United States Patent
Quinn et al.

(10) Patent No.: US 12,442,070 B2
(45) Date of Patent: Oct. 14, 2025

(54) GAS BEARING PLATE WITH INTEGRATED OVJP VACUUM SOURCE

(71) Applicant: Universal Display Corporation, Ewing, NJ (US)

(72) Inventors: William E. Quinn, Whitehouse Station, NJ (US); Craig Anthony Outten, Rydal, PA (US); Kent Khuong Nguyen, San Jose, CA (US); Steven Shigeki Aochi, San Jose, CA (US); Neil D. Nguyen, Milpitas, CA (US)

(73) Assignee: Universal Display Corporation, Ewing, NJ (US)

( * ) Notice: Subject to any disclaimer, the term of this patent is extended or adjusted under 35 U.S.C. 154(b) by 642 days.

(21) Appl. No.: 17/848,674

(22) Filed: Jun. 24, 2022

(65) Prior Publication Data

US 2023/0011198 A1    Jan. 12, 2023

Related U.S. Application Data

(60) Provisional application No. 63/289,702, filed on Dec. 15, 2021, provisional application No. 63/227,688, (Continued)

(51) Int. Cl.
*C23C 14/22* (2006.01)
*C23C 14/04* (2006.01)
(Continued)

(52) U.S. Cl.
CPC ............ *C23C 14/24* (2013.01); *C23C 14/04* (2013.01); *C23C 14/12* (2013.01); *C23C 14/228* (2013.01)

(58) Field of Classification Search
None
See application file for complete search history.

(56) References Cited

U.S. PATENT DOCUMENTS

| 4,769,292 A | 9/1988 | Tang |
| 5,247,190 A | 9/1993 | Friend |
| (Continued) | | |

FOREIGN PATENT DOCUMENTS

| EP | 2865981 | 4/2015 |
| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.
(Continued)

*Primary Examiner* — Binu Thomas
(74) *Attorney, Agent, or Firm* — Butzel Long

(57) ABSTRACT

Embodiments of the disclosed subject matter provide a system having at least one carrier gas source, at least one heated container that includes organic material, and a jet array print head that includes a plurality of apertures to print lines on a substrate, and that is connected to a vacuum source. The system includes a pair of gas bearing plates, with a top gas bearing plate and a bottom gas bearing plate, each having a plurality of pressure apertures and vacuum apertures. The top gas bearing plate applies a uniform force to a top surface of the substrate, and the bottom gas bearing plate applies a uniform force to a bottom surface of the substrate. The top gas bearing plate includes a slot configured for the print head to fit within. The vacuum apertures are arranged perpendicular to a direction of travel of the substrate.

13 Claims, 31 Drawing Sheets

Related U.S. Application Data filed on Jul. 30, 2021, provisional application No. 63/217,737, filed on Jul. 1, 2021.

(51) Int. Cl.
*C23C 14/12* (2006.01)
*C23C 14/24* (2006.01)

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,537,688 B2 | 3/2003 | Silvernail | |
| 6,597,111 B2 | 7/2003 | Silvernail | |
| 6,664,137 B2 | 12/2003 | Weaver | |
| 6,835,950 B2 | 12/2004 | Brown | |
| 6,888,305 B2 | 5/2005 | Weaver | |
| 6,888,307 B2 | 5/2005 | Silvernail | |
| 6,897,474 B2 | 5/2005 | Brown | |
| 7,187,119 B2 | 3/2007 | Weaver | |
| 7,279,704 B2 | 10/2007 | Walters | |
| 7,431,968 B1 | 10/2008 | Shtein | |
| 7,683,534 B2 | 3/2010 | Weaver | |
| 7,968,146 B2 | 6/2011 | Wagner | |
| 11,168,391 B2 | 11/2021 | Van Den Tillaart | |
| 11,201,288 B2 | 12/2021 | Xu | |
| 2003/0230980 A1 | 12/2003 | Forrest | |
| 2004/0174116 A1 | 9/2004 | Lu | |
| 2013/0038649 A1* | 2/2013 | Lowrance | B41J 2/01 137/561 A |
| 2013/0040061 A1* | 2/2013 | Lowrance | B41J 2/01 118/500 |
| 2014/0295615 A1* | 10/2014 | Mohan | C23C 14/228 118/729 |
| 2015/0376787 A1 | 12/2015 | McGraw | |
| 2015/0380648 A1 | 12/2015 | McGraw | |
| 2017/0044464 A1 | 2/2017 | Ford | |
| 2017/0229663 A1 | 8/2017 | Tsai | |
| 2017/0294615 A1 | 10/2017 | Van Den Tillaart | |
| 2018/0342675 A1 | 11/2018 | Xu | |
| 2019/0218655 A1 | 7/2019 | McGraw | |
| 2019/0221783 A1 | 7/2019 | McGraw | |
| 2019/0386256 A1* | 12/2019 | Quinn | C23C 14/24 |
| 2022/0190245 A1* | 6/2022 | Nguyen | C23C 14/228 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

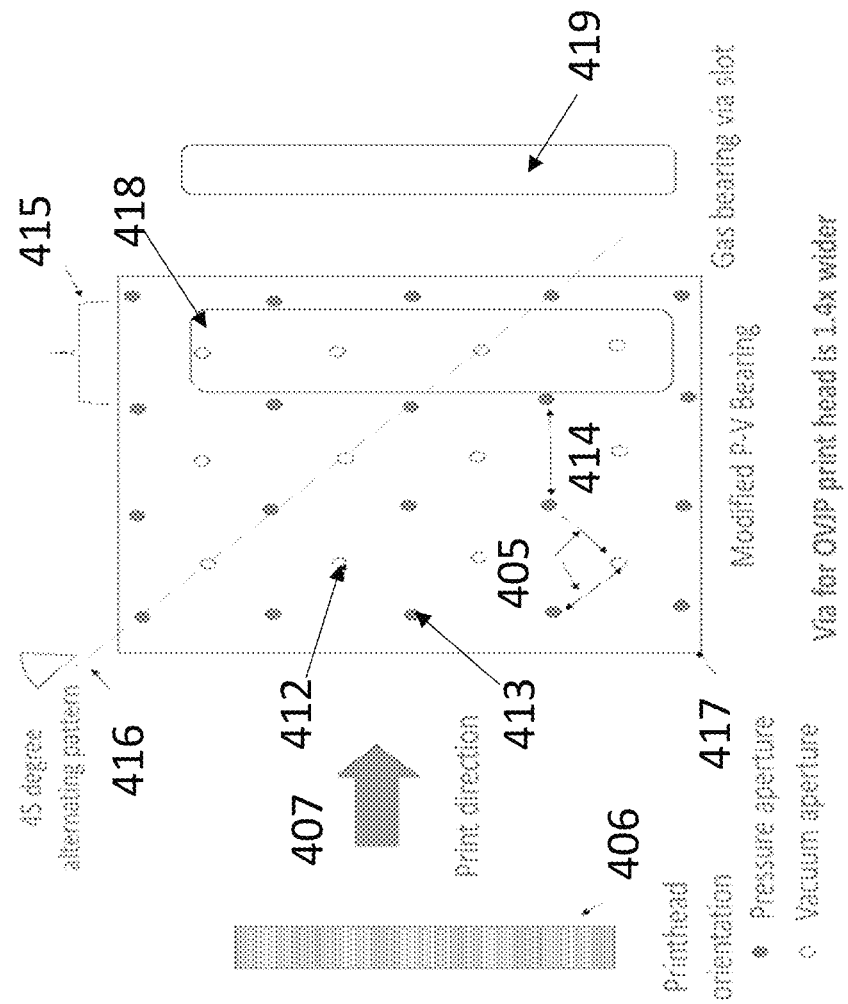
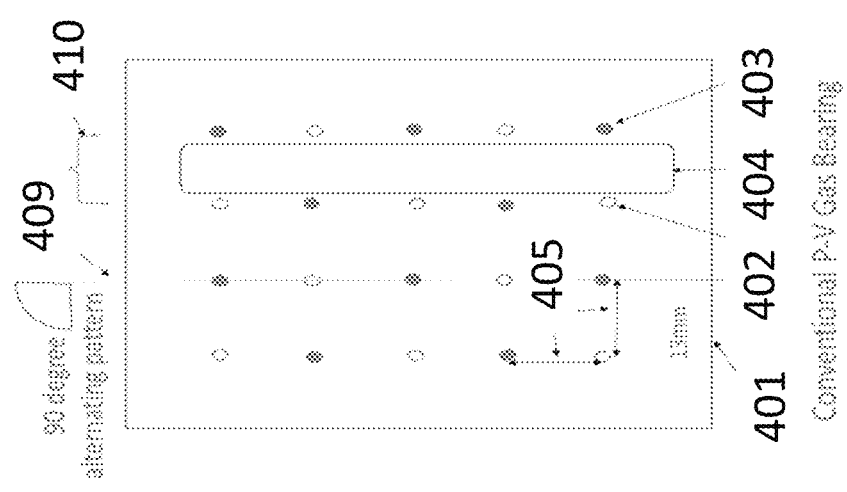

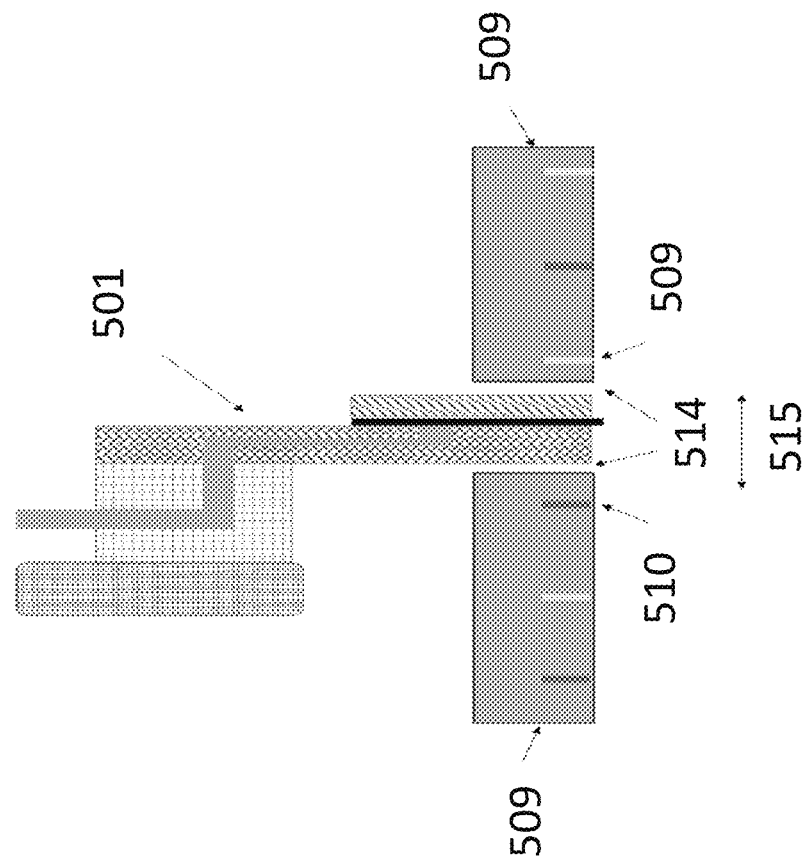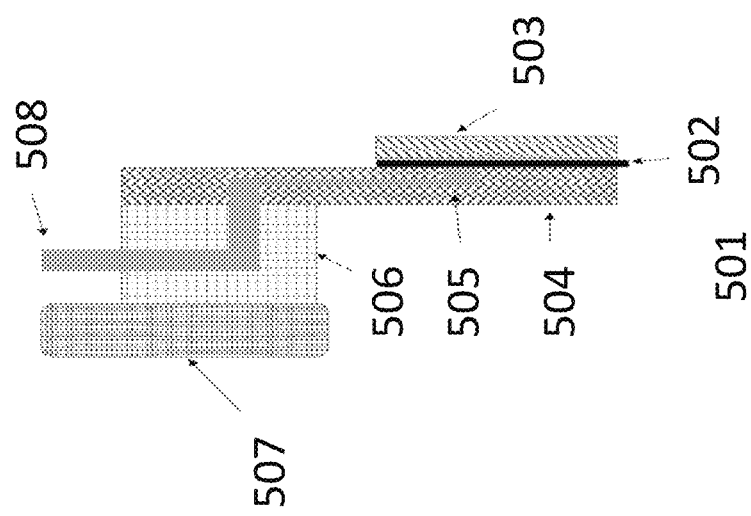

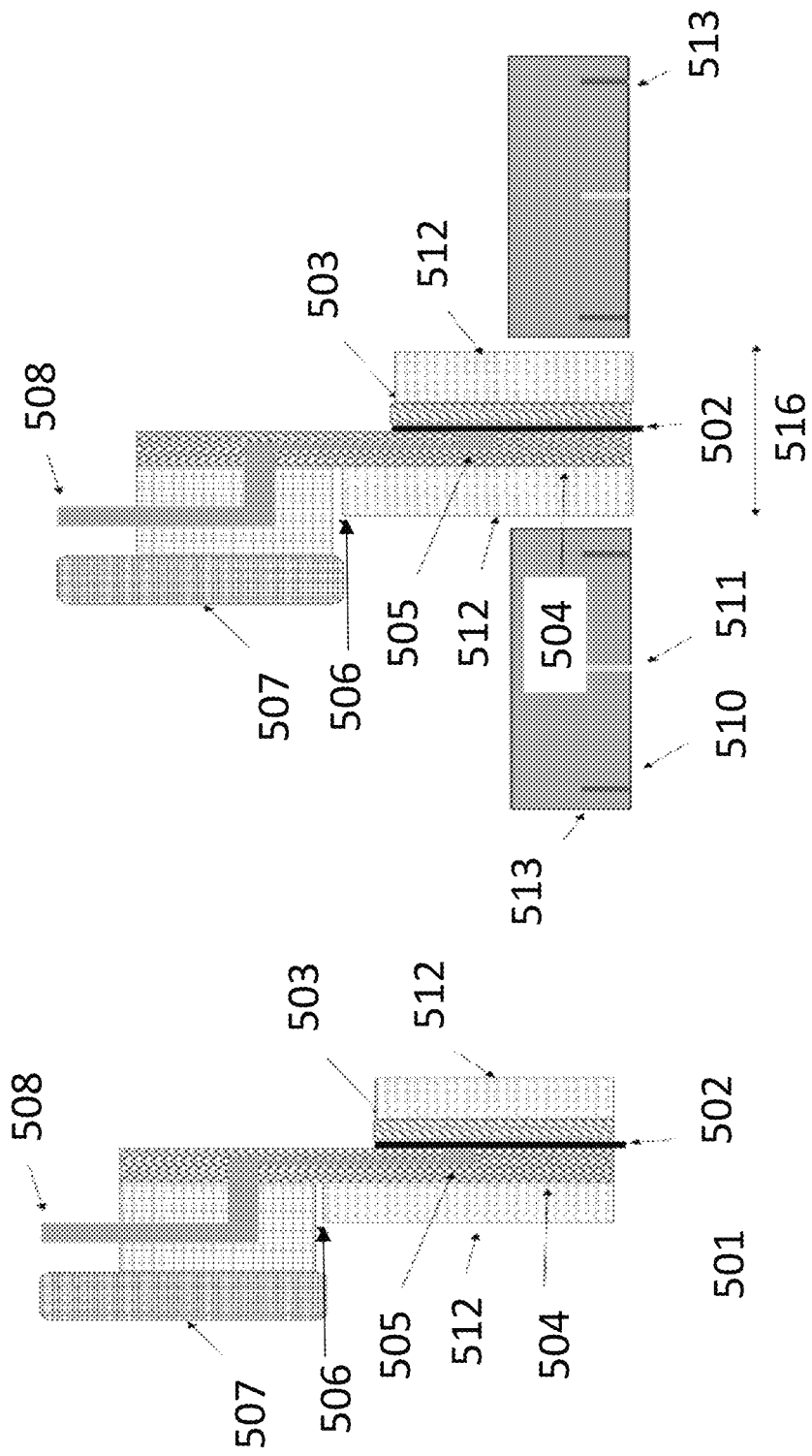

GAS BEARING PLATE WITH INTEGRATED OVJP VACUUM SOURCE

CROSS-REFERENCE TO RELATED APPLICATIONS

This application claims priority to U.S. Patent Application Ser. No. 63/217,737, filed Jul. 1, 2021, the entire contents of which are incorporated herein by reference.

FIELD

The present invention relates to an Organic Vapor Jet Printing (OVJP) device having pressure-vacuum (P-V) air bearings for fabricating organic emissive devices, such as organic light emitting diodes, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue"

layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321] |
| Central Blue | Locus: [0.1746, 0.0052]; [0.0326, 0.3530]; Interior: [0.2268, 0.3321] |
| Central Yellow | Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a system may include at least one carrier gas source, at least one heated container that includes organic material, and a jet array print head that includes a plurality of apertures to print lines on a substrate, and that is connected to a vacuum source. The system may include a plurality of gas lines that are communicatively coupled the at least one carrier gas source, the at least one heated container, and the jet array print head. The carrier gas may transmit the organic material through the gas lines to the jet array print head that contains the jetting apertures. The system may include a pair of gas bearing plates, including a top gas bearing plate and a bottom gas bearing plate, each having a plurality of pressure apertures and vacuum apertures. The top gas bearing plate may apply a uniform force to a top surface of the substrate, and the bottom gas bearing plate may apply a uniform force to a bottom surface of the substrate. The top gas bearing plate may include a slot configured for the print head to fit within. The vacuum apertures of the pair of gas bearing plates may be arranged perpendicular to a direction of travel of the substrate.

The pressure apertures of the pair of gas bearing plates are arranged in a pattern that is 45 degree from the vacuum apertures.

The pair of gas bearing plates are comprised of at least one of metal, ceramic, and/or silicon carbide.

The pressure apertures and exhaust apertures are arranged on the pair of gas bearing plates in an alternating pattern that runs parallel to at least one edge of each of the pair of gas bearing plates.

A width of the slot may be 25 mm or less, 20 mm or less, 15 mm of less, 10 mm or less, 8 mm or less, and/or 5 mm or less.

A flatness of the substrate disposed between the top gas bearing plate and the bottom gas bearing plate may be less than 10 µm, less than 5 µm, less than 2 µm, and/or less than 1 µm.

The jet array print head may include a print die, and a gas manifold with an embedded heater that is coupled to a heated injection block. The injection block may be coupled to a device to control a gap between the jet array print head and the substrate. The injection block may include an interface to a gas and vacuum distribution network. The system may include (i) insulation disposed on outer surfaces of the gas manifold and the embedded heater, and/or (ii) an active cooling device configured to cool a volume surrounding the heated gas manifold.

A first spacing distance between each of the vacuum apertures of the pair of gas bearing plates may be the same as a second spacing distance between each of the pressure apertures of the pair of gas bearing plates. The first spacing between the vacuum apertures or the second spacing of the pressure apertures in the pair of gas bearing plates may be 25 mm or less, 20 mm or less, 15 mm or less, 10 mm or less, 8 mm or less, 6 mm or less, 5 mm or less, 4 mm or less, 3 mm or less, 2 mm or less, and/or 1 mm or less.

The print head may be an organic vapor jet printing (OVJP) print head.

According to an embodiment, a consumer electronic device fabricated using the system that may include at least one carrier gas source, at least one heated container that includes organic material, and a jet array print head that includes a plurality of apertures to print lines on a substrate, and that is connected to a vacuum source. The system may include a plurality of gas lines that are communicatively coupled the at least one carrier gas source, the at least one heated container, and the jet array print head. The carrier gas may transmit the organic material through the gas lines to the jet array print head that contains the jetting apertures. The system may include a pair of gas bearing plates, including a top gas bearing plate and a bottom gas bearing plate, each having a plurality of pressure apertures and vacuum apertures. The top gas bearing plate may apply a uniform force to a top surface of the substrate, and the bottom gas bearing plate may apply a uniform force to a bottom surface of the substrate. The top gas bearing plate may include a slot configured for the print head to fit within. The vacuum apertures of the pair of gas bearing plates may be arranged perpendicular to a direction of travel of the substrate.

The device may at least one of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and/or a sign.

BRIEF DESCRIPTION OF THE DRAWINGS

FIG. 5A shows a conventional P-V gas bearing.

FIG. 5B shows a modified P-V gas bearing according to an embodiment of the disclosed subject matter.

FIG. 6A-6D show a side view of an access slot in the P-V gas bearing, and configurations of a print head according to embodiments of the disclosed subject matter.

FIG. 8A shows the cross section superimposed on a typical OLED substrate and FIG. 8B shows the use of an OVJP depositor for large area coverage.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
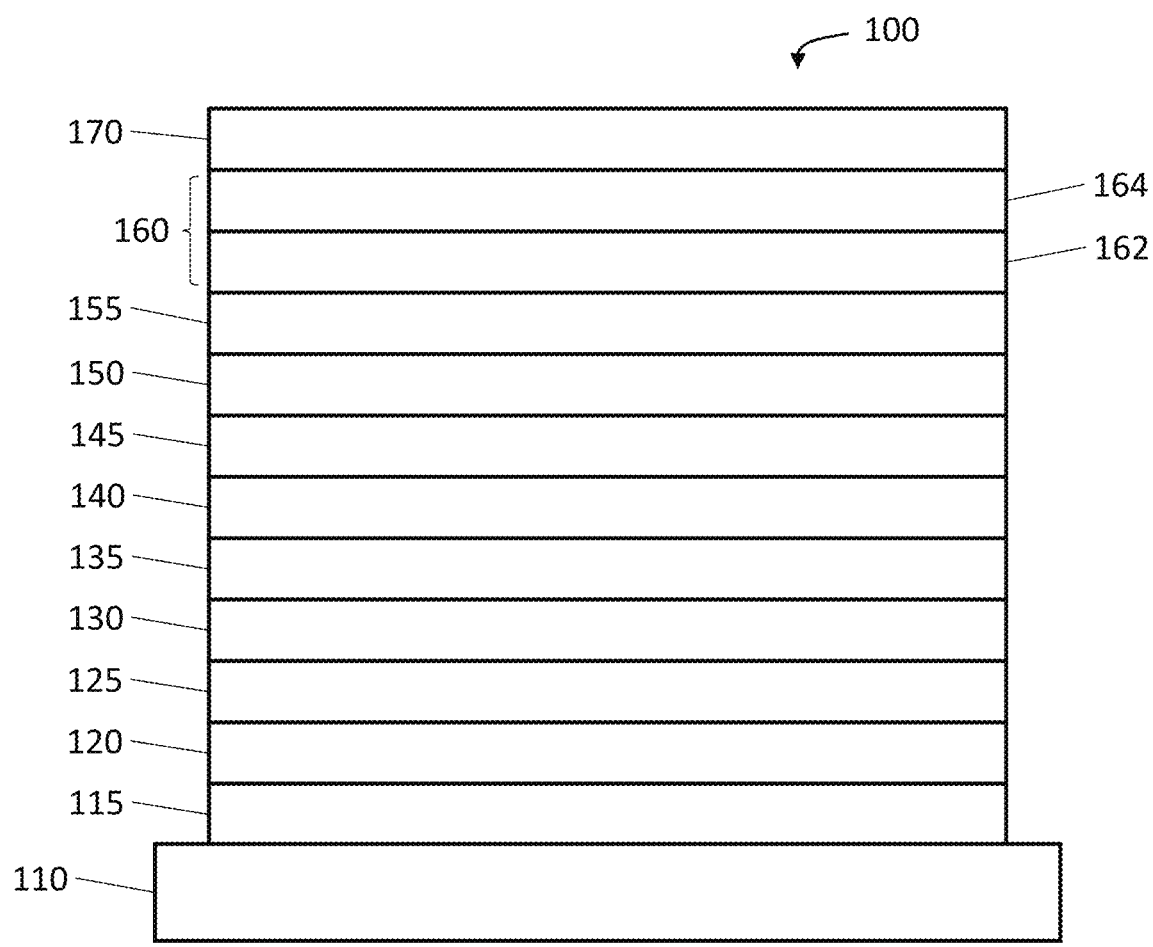
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
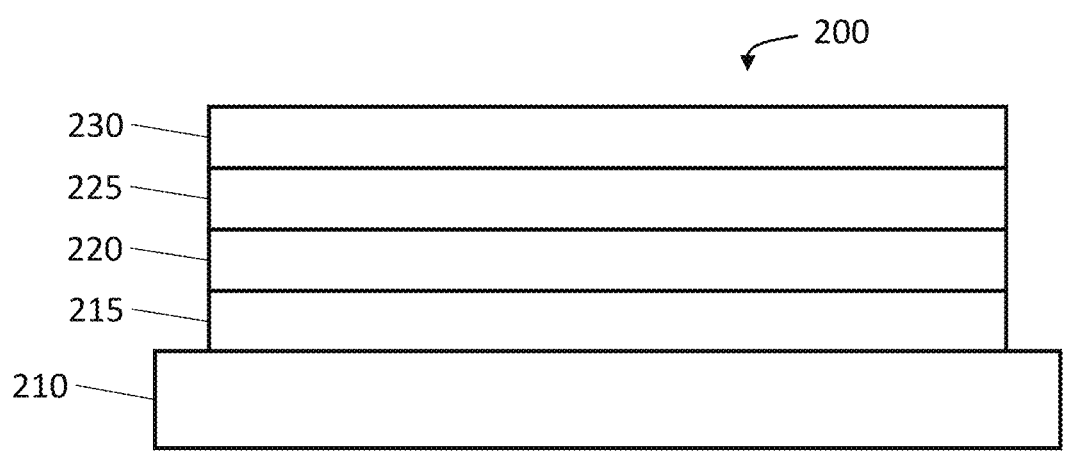
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, nonmetal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small ΔES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Organic Vapor Jet Printing (OVJP) is a technique used to print fine lines of organic material on a display backplane without the use of fine metal shadow masks or liquid solvents. The method currently employed to produce mobile and laptop displays uses evaporation sources and fine metal masks to pattern the deposition. Fine metal masks are typically not suitable for use in manufacturing large area displays because the masks cannot be stretched with sufficient force to prevent sagging. Ink jet printing is a potential patterning technique for OLED displays, but the use of solvents to make the inks seriously degrades the performance of the light emitting devices. OVJP eliminates these two issues by printing lines having pixel width without the use of fine metal masks. OVJP uses state of the art OLED materials without dissolving them in solvent.

In OVJP, OLED materials are heated in an enclosed container to an elevated sublimation temperature and transported to a print head through heated gas lines using an inert carrier gas. The print head contains jetting apertures with a spacing that corresponds to the pixel spacing of the display. Apertures are formed in silicon wafers using standard MEMS (micro-electromechanical system) fabrication techniques. Functional OVJP dies are cut from the wafer, with the apertures along one face of the die. Excess organic material is removed from the printing area by vacuum channels inserted into the print die. The aperture face of the die is held above a moving display backplane, and lines corresponding to the pixels are printed on the backplane, as shown in FIGS. 3A-3B.

Figure 3A:
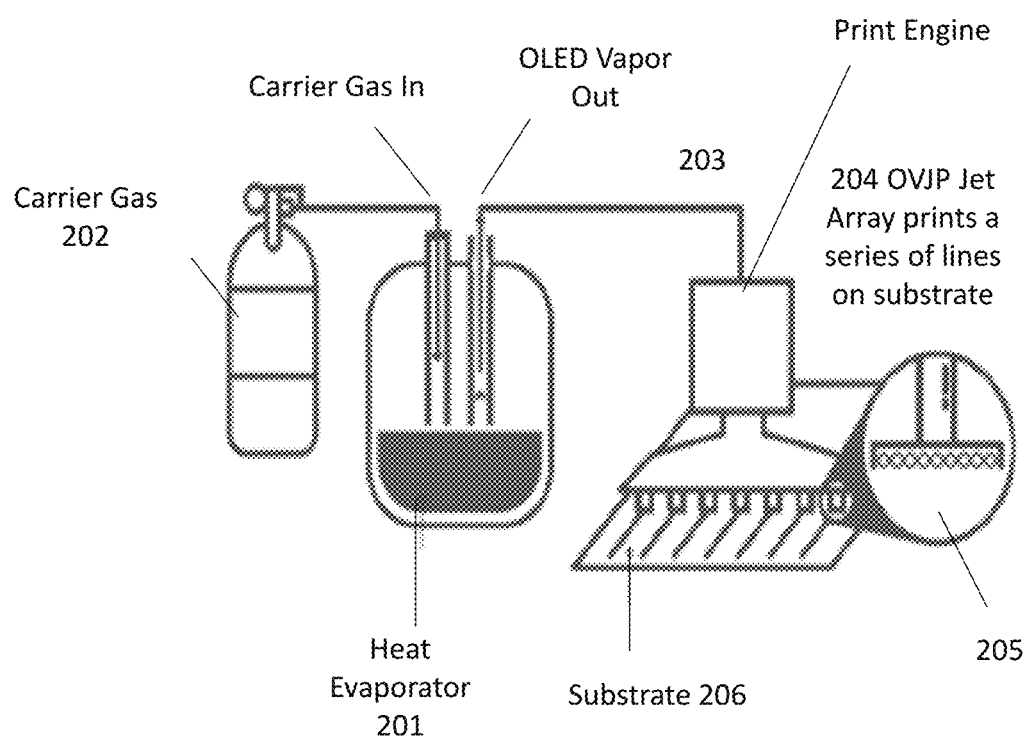
FIG. 3A shows an OVJP deposition system.
Figure 3B:
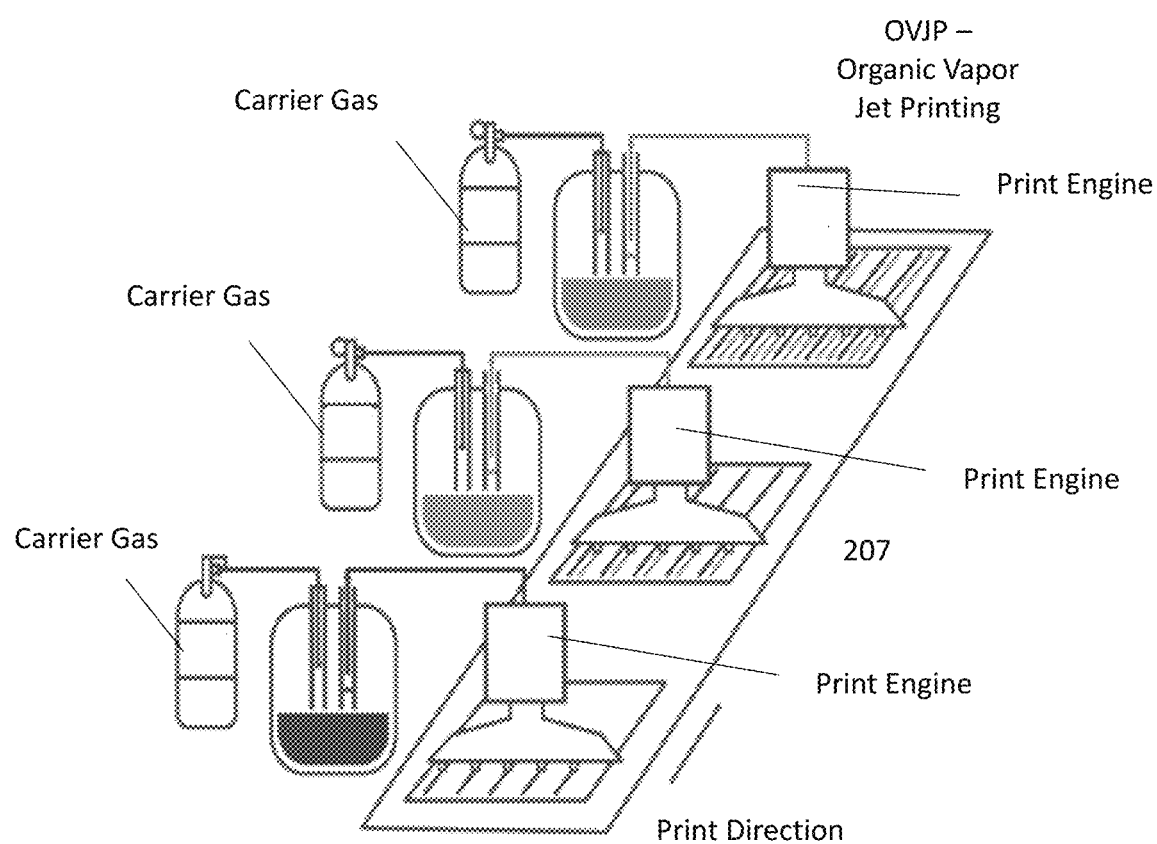
FIG. 3B shows an OVJP deposition system configured to print emissive layers configured to emit three different colors in one deposition chamber.

FIG. 3A shows the main components of an OVJP printing system. Organic material is heated in a closed container 201, transported using an inert carrier gas 202 through heated gas lines 203 to the jet array that contains the jetting apertures 205. The apertures are spaced 20 µm to 60 µm from the surface of the substrate 206. FIG. 3B is a schematic diagram of an OVJP deposition system capable of printing 3 colors in one deposition chamber.

The gap between the print die and the surface of the backplane may be accurately controlled by measuring the gap in real time and moving the print head relative to the surface of the backplane substrate. However, the flatness of the glass substrate may be considered when designing the length of the print die. The surface peak-to-peak distance (i.e., the distance between neighboring high spots on the surface of the substrate) and peak-to-valley height difference may be used to determine the die length. A print die may be short for a predetermined distance range when the peak-to-peak distance is small (e.g., less than 100 mm), and/or the peak-to-valley height difference exceeds a predetermined fly height tolerance. A short die may enable steeper die angles relative to the substrate surface and better fidelity in following a rolling surface topology. It is desirable to use a longer print die to limit the number of die and associated control hardware for a print bar in an OVJP system. A longer print die may use flatter glass surfaces with peak-to-peak distances that are longer than the die, and peak-to-valley differences that may be less than the fly height tolerance. One arrangement that may be used to flatten the glass surface of the substrate are opposing P-V (pressure-vacuum) type gas bearings.

A P-V gas bearing table that is formed from opposing P-V bearings works by applying a uniform force on the top and bottom surfaces of the glass substrate which is floating on the lower gas bearing. The pressure and vacuum levels in the top bearing may be adjusted so that the bearing facing the surface of the substrate to be flattened is stiffer than the opposing bearing. In this case, the upper bearing may be stiffer, as OVJP prints on the top glass surface of the substrate. The extent to which the glass substrate may be flattened is a function of the spacing between the pressure and vacuum apertures, the pressure and vacuum levels, and/or the distance between the planar bearing surface and the surface of the glass substrate. Closer spacing between the air bearing the surface of the substrate may allow for better flattening of the substrate. Closer spacing may increase the pressure and/or vacuum gas volumes, and/or may increase fabrication cost.

For OVJP printing, the substrate flatness may be 1 µm peak-to-valley over a 150 mm span. To achieve this flatness in the substrate, the spacing of pressure and vacuum apertures in the P-V bearing may be, for example, 13 mm (e.g., spacing 405 as shown in FIG. 5A).

Figure 4:
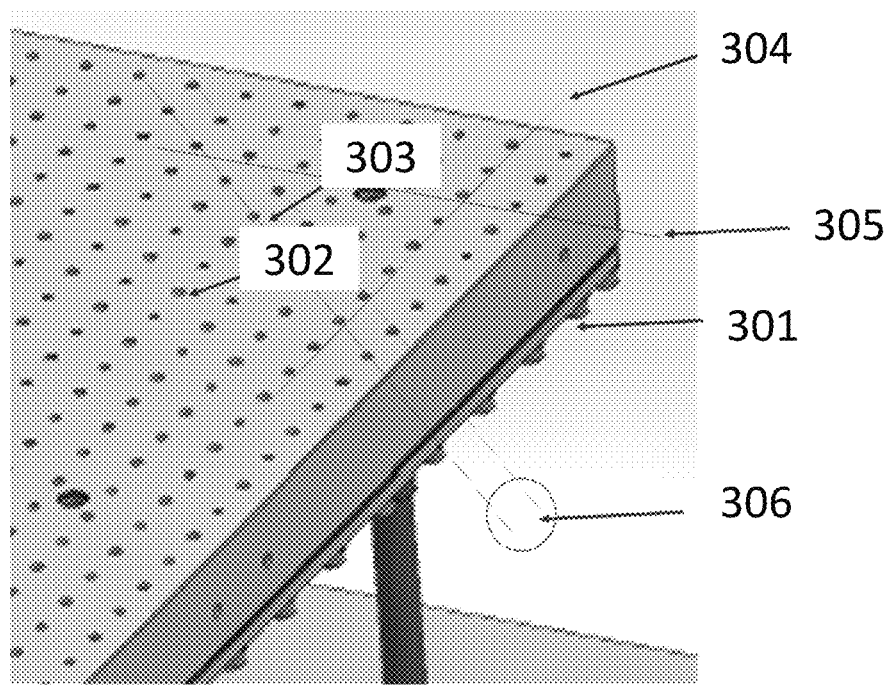
FIG. 4 shows a planar pressure-vacuum (P-V) type gas bearing.

FIG. 4 shows a planar P-V gas bearing. The bearing 301 is fabricated from metal, such as aluminum, by placing a plurality of pressure apertures 302 and vacuum apertures 303 on the surface of a flat plate in an alternating pattern. The pattern of alternating apertures runs parallel to the edges 304, 305 of the rectangular bearing plate 301. A slot (not shown in FIG. 4) may cut into the upper P-V bearing so that the print head is in fluid communication with the surface of the substrate.

OVJP may utilize a silicon die as part of a print head that deposits narrow lines on a glass substrate. The die may be made by etching grooves part way through a pair of silicon wafers, and bonding the wafers together so that the grooves face the wafer bond and form enclosed channels. Vias may be etched into one face of one silicon wafer to expose the channels. The wafers may be diced in a direction perpendicular to the direction of the channels, exposing the channels along the edge of the die. Channels may be one pixel-width apart (i.e., one pixel of an OLED) so that lines printed by the channels in the die match the spacing on the substrate. OLED materials may be transported from heated crucibles to the print die using heated carrier gas, such as shown in FIGS. 3A-3B. The print head of the OVJP systems shown in FIGS. 3A-3B may be heated to prevent condensation of OLED materials. A slot may be cut into the upper P-V bearing so that the print head is in fluid communication with the surface of the substrate.

Alternating P-V bearing apertures may be configured in a pattern that is parallel to the edges of the P-V bearing plate 401 as shown in FIG. 5A. The pressure apertures 403 and vacuum apertures 402 may be disposed in an alternating arrangement along rows and columns that are parallel to the bearing edges 409 and to the direction of substrate movement 407. The slot 404, 418, 419 shown in FIGS. 5A-5B may be used for clearance of the print head. The slot may be cut through a portion of the P-V bearing plate that does not have the P-V apertures so that the flatness may be maintained. Cutting the slot in the solid portion of the plate may limit the slot width to a maximum of about 11 mm (e.g., width 410, shown in FIG. 5A). Initial calculations on the performance of the top gas bearing indicate that the optimal flatness of the substrate may obtained with a slot width of 8 mm or less, preferably 5 mm, but other suitable ranges of slot lengths are described below.

Referring to FIGS. 6A-6D, the print head 501 is presently unable to be manufactured to fit into a slot 5 mm wide, as the print head may include a number of planar components, such as a silicon print die 502 having 1 mm thickness, an aluminum nitride or columnar silicon gas manifold with imbedded heater 504, 506 which may have a 2.5 mm thickness, and a backside aluminum nitride heater 503, which may have a 1 mm thickness. The gas manifold heater assembly may be attached to a metal injection block 506 that includes the interface 508 to the gas and vacuum distribution network and is affixed to a mechanism 507 to control the gap between the print die and substrate. An air gap 514 of at least 1 mm may be provided on each side of the print head for mechanical clearance and to prevent overheating the gas bearing 509. Pressure apertures 510 and vacuum apertures 511 may alternate in the directions parallel and perpendicular to the clot cut into the gas bearing plate. The minimum thickness of the print head may be 4.5 mm, not including the air gaps. The print head may operate at an elevated temperature and may be in close proximity to the P-V gas bearing plate (e.g., within a predetermined distance of the P-V gas bearing plate). The temperature of the P-V gas bearing plate may be uniform to maintain dimensional tolerances of the bearing plate and substrate. Insulation and heat removal devices may be added to the print head to accomplish this, but may increase the size of the print head such that it is not able to fit through the slot in a conventional gas bearing.

To overcome this limitation and provide additional clearance, embodiments of the disclosed subject matter may use the vacuum channels of the OVJP pint die as gas bearing vacuum apertures under the print die 417. This may increase the spacing between neighboring P-V gas bearing apertures from 13 mm to 26 mm by using the print head vacuum to replace the air bearing vacuum apertures. In the embodiments of the disclosed subject matter, the aperture pattern 416 may be rotated 45 degrees to the bearing edge to align the print head with the print direction, such as shown in FIG. 5. This arrangement may reduce the maximum width to 1.41 times the standard aperture spacing shown in 414, 415, which may be 15.5 mm. This may not change the aperture spacing of 13 mm compared to the base line case.

FIG. 6C shows the added slot clearance when ceramic insulation is added so that the die vacuum may be used as the vacuum source for the portion of the P-V table that contains the die slot according to embodiments of the disclosed subject matter. Print head 501 thickness may be increased by the addition of ceramic insulation 512 on the outer surfaces of the gas manifold and/or heater (e.g., AlN heater). FIG. 6D shows modified gas bearing plate 513 showing larger via slot 418 and 45 degree pattern pressure 510 and vacuum apertures 511. A slot width 515 for the standard, parallel aperture pattern 515 is 11 mm, and the slot width 516 for the 45 degree rotated aperture pattern of embodiments of the disclosed subject matter may be 15.5.

According to embodiments of the disclosed subject matter a system may include at least one carrier gas source (e.g., a carrier gas source 202 shown in FIGS. 3A-3B), at least one heated container that includes organic material (e.g., heater evaporator 201 shown in FIGS. 3A-3B), and a jet array print head (e.g., OVJP jet array 204 shown in FIGS. 3A-3B) that includes a plurality of apertures to print lines on a substrate (e.g., substrate 206), and that is connected to a vacuum source. The print head may be an organic vapor jet printing (OVJP) print head. The system may include a plurality of gas lines (e.g., gas lines 203) that are communicatively coupled the at least one carrier gas source, the at least one heated container, and the jet array print head. The carrier gas may transmit the organic material through the gas lines to the jet array print head that contains the jetting apertures.

The system may include a pair of gas bearing plates (e.g., shown in FIG. 5B), including a top gas bearing plate and a bottom gas bearing plate, each having a plurality of pressure apertures (e.g., pressure apertures 413 shown in FIG. 5B) and vacuum apertures (e.g., vacuum aperture 412 shown in FIG. 5B). The pressure apertures of the pair of gas bearing plates are arranged in a pattern that is 45 degree from the vacuum apertures, as shown in pattern 416 of FIG. 5B. The pair of gas bearing plates are comprised of at least one of metal, ceramic, and/or silicon carbide. The pressure apertures and exhaust apertures are arranged on the pair of gas bearing plates in an alternating pattern that runs parallel to at least one edge of each of the pair of gas bearing plates. The vacuum apertures of the pair of gas bearing plates may be arranged perpendicular to a direction of travel of the substrate (e.g., print direction 407 shown in FIG. 5B).

The top gas bearing plate may apply a uniform force to a top surface of the substrate, and the bottom gas bearing plate may apply a uniform force to a bottom surface of the substrate. A flatness of the substrate disposed between the top gas bearing plate and the bottom gas bearing plate may be less than 10 µm, less than 5 µm, less than 2 µm, and/or less than 1 µm. The top gas bearing plate may include a slot (e.g., slot 418 shown in FIG. 5B) configured for the print head to fit within. A width of the slot 418 shown in FIG. 5B may be 25 mm or less, 20 mm or less, 15 mm of less, 10 mm or less, 8 mm or less, and/or 5 mm or less.

The jet array print head may include a print die (e.g., print die 502 shown in FIGS. 6A-6D), and a gas manifold (e.g., gas manifold 505) with an embedded heater (e.g., heater 504, 506) that is coupled to a heated injection block (e.g., heated injection block 506). The injection block may be coupled to a device to control a gap between the jet array print head and the substrate (not shown). The injection block may include an interface to a gas and vacuum distribution network (e.g., distribution network 508). The system may include (i) insulation (e.g., insulation 512 shown in FIGS. 6C-6D) disposed on outer surfaces of the gas manifold and the embedded heater, and/or (ii) an active cooling device configured to cool a volume surrounding the heated gas manifold.

A first spacing distance between each of the vacuum apertures of the pair of gas bearing plates may be the same as a second spacing distance between each of the pressure apertures of the pair of gas bearing plates (e.g., where the spacing is distance 414 shown in FIG. 5B). The first spacing between the vacuum apertures or the second spacing of the pressure apertures in the pair of gas bearing plates may be 25 mm or less, 20 mm or less, 15 mm or less, 10 mm or less, 8 mm or less, 6 mm or less, 5 mm or less, 4 mm or less, 3 mm or less, 2 mm or less, and/or 1 mm or less.

Figure 7A:
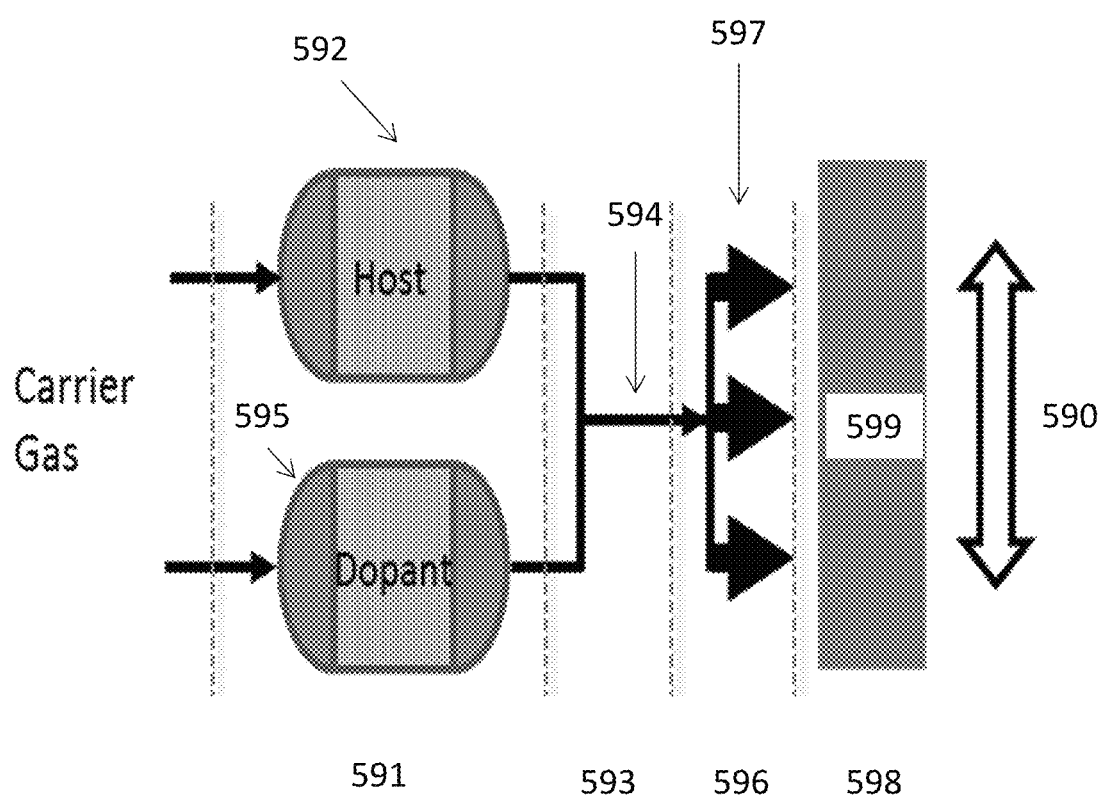
FIG. 7A shows a simplified diagram of the process gas and organic vapor flow through an OVJP process according to embodiments disclosed herein.

As previously disclosed, Organic Vapor Jet Printing (OVJP) is an emerging, solvent-less organic thin film deposition technology designed to print OLED displays. It utilizes a carrier gas to transport organic material from a heated source container to the print nozzle assembly which is in close proximity to a substrate. The OVJP process may be divided into four basic steps: entrainment, mixing, jetting, and condensation. An example OVJP process is illustrated in FIG. 7A. In the first step 591, organic vapor generated in a source such as a sublimation oven 592 is entrained in a stream of inert gas. In the second step 593, the vapor and gas stream are mixed in a heated plenum 594 with streams from other vapor sources 595 as required to make a film of the desired composition. Thirdly 596, the flow of mixed vapor is collimated into well-defined jets by an array of heated nozzles 597. Finally at 598, organic vapor condenses on a substrate 199 where the jet impinges. The substrate is much cooler than the sublimation temperature of the organic vapor and may be actively cooled. A patterned thin film can be generated by moving the substrate relative to the nozzle 590. In some embodiments it may be preferable to print films as continuous lines rather than discrete pixels since it permits the OVJP system to operate in steady state.

The design of the print nozzle assembly and the deposition conditions determines characteristics of the printed line. Early versions of OVJP print heads could produce printed lines with a line width required to deposit the emissive layers of individual subpixels in a multicolor OLED display (on the order of 50 µm), but the lines had unacceptable overspray and printing could not be started and stopped rapidly. Recently, novel micronozzle array technology has been developed which utilizes a combination of deposition apertures surrounded by exhaust apertures and a gas confinement flow to confine the line width and overspray, referred to as Deposition Exhaust Confinement (DEC) nozzle technology. Conventional DEC-type depositors and DEC depositors disclosed herein operate generally with the same procedure as other OVJP depositors, but have different physical structures that allow for improved deposition footprint and more efficient device fabrication.

Figure 7B:
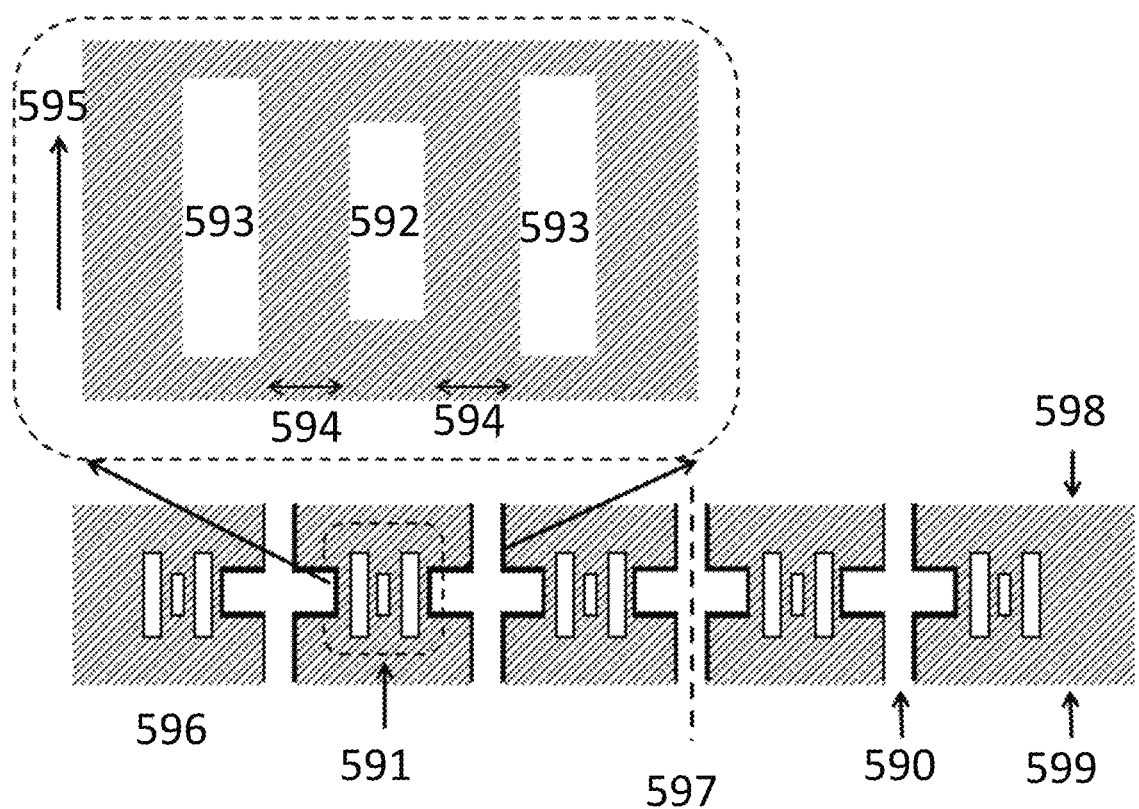
FIG. 7B shows a diagram of a micronozzle array of OVJP depositors that contains exhaust apertures and confinement gas flows in addition to delivery apertures according to embodiments disclosed herein.

The use of gas confinement is a departure from previous OVJP concepts since it requires a chamber pressure of 50 to 300 Torr, rather than high vacuum. Overspray is significantly reduced or completely eliminated by using a flow of confinement gas to prevent the diffusion and transport of organic material away from the desired deposition region. The DEC depositor design, shown from the perspective of the substrate in FIG. 7B, includes a planar surface 591 ported with one or more delivery 592 apertures located between a pair of exhaust apertures 593. The flow through the delivery apertures contains organic vapor entrained in an inert delivery gas. Exhaust apertures withdraw gas from the region under the depositor at a mass flow rate exceeding the delivery flow. The exhausts remove the delivery flow and any surplus organic vapor entrained within it, as well as a balance of confinement gas drawn from the ambient surrounding the depositor. Delivery and exhaust apertures are separated by a DE spacer 594. The apertures may be rectangular and may be arranged with their long axes parallel to the direction of printing 595.

Depositors are usually arranged linearly on a micronozzle array 596, so that each depositor borders another on at least one side boundary 597. The top and bottom edges of the depositor 598, 599, respectively, are defined by the edges of the micronozzle array. Distribution trenches 590 etched into the lower face of the depositor provide a low impedance path for confinement gas so that its flow is evenly distributed across the side boundaries of each depositor. Alternately, confinement gas may flow in from the edges of the depositor, particularly if these channels are omitted. Arrays may be designed to minimize crosstalk between depositors so that multiple printed features are as close to identical as possible across the width of the depositor array. Additional exhaust apertures may be placed at the ends of the array, for example, to minimize edge effects. The flow field under a micronozzle array therefore has periodic symmetry. Depositors can have apertures with a wide variety of shapes, designed to produce features of specific sizes and feature profiles. Specific designs are outlined in US Patent Application Pub. Nos. 2015/0376787, 2017/044464, and 2018/0342675, the disclosure of each of which is incorporated by reference in its entirety. A depositor may be defined as a cluster of apertures within a micronozzle array capable of printing a single feature with the same width and normalized thickness profile as one of features printed in a single pass of the entire micronozzle array. If a depositor contains multiple delivery apertures, these apertures are fed from a common delivery channel.

DEC depositors as disclosed herein typically operate differently than, and produce different results than, other non-OVJP deposition systems which typically are used to produce blanket films, such as on semiconductor devices and similar substrates. Such non-OVJP depositors often use material dispensed from multiple openings in a depositor, such as a "showerhead" configuration, and may include evacuation components to remove excess material from the edges of the deposition area. However, such depositors are not capable of depositing clean, small areas of organic emissive materials and other materials used in OLEDs and similar devices.

The average thickness t of a printed film is given by $t=\eta_a j\tau/\rho$, where j is the mass flux of organic vapor onto the substrate, $\tau$ is the period of time a given point on the substrate is under the aperture, and p is the density of the condensed organic material. The utilization efficiency, $\eta$, is the fraction of organic vapor issuing from the depositor that condenses on the substrate. Because $\tau=l/v$, where l is the length of the aperture and v is the relative velocity between the print head and the substrate, a longer delivery aperture permits a given point on the substrate surface to remain under the aperture for a longer time at a given print speed. This permits faster printing. The apertures of a DEC depositor are generally made to the greatest length that manufacturing techniques will permit. While increased length improves printing speed, it does not necessarily improve $\eta$.

Figure 7C:
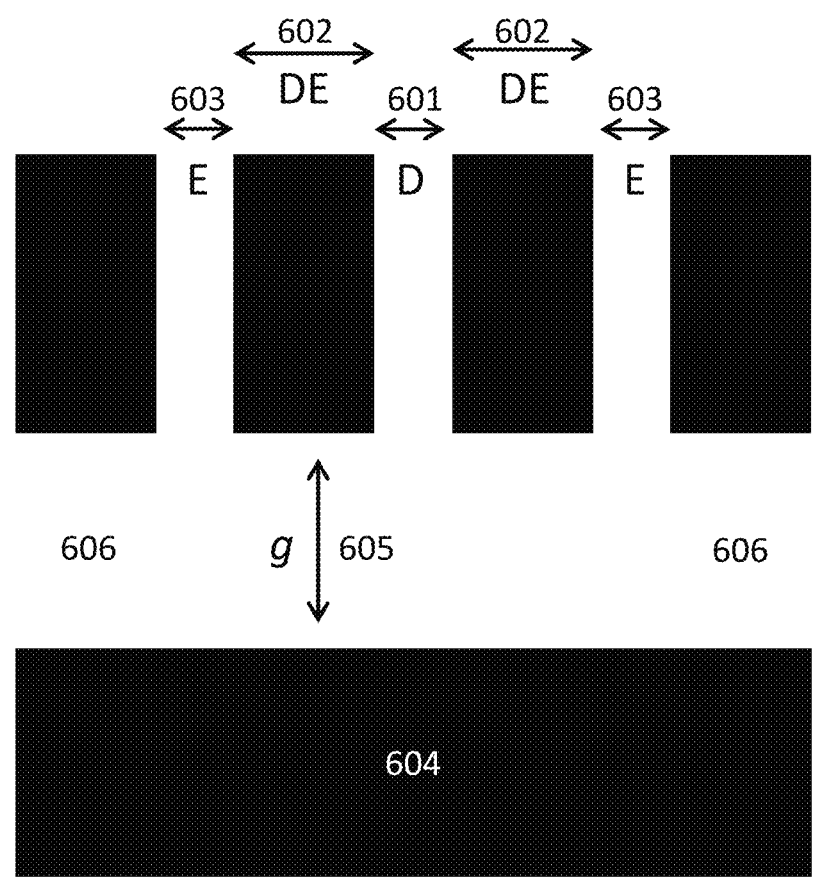
FIG. 7C shows a cross sectional view of an OVJP depositor according to embodiments disclosed herein.

A DEC depositor is shown in cross-section a cross section normal to the direction of printing in FIG. 7C. The dimensions defining its geometry are illustrated. The width of the delivery aperture 601 is D. The mass flow rate of delivery gas through the delivery aperture is given by QD. The DE spacers between the delivery and exhaust have width DE 602 and the exhausts have width E 603. The mass flow rate of gas through the exhaust apertures of a depositor is QE. The depositor and substrate 604 are separated by a fly height gap g 605.

Confinement gas may be fed into the depositor from the edges 606 at rate QC. The flow of confinement gas opposes the outward spread of organic vapor and directs surplus organic vapor away from the deposition zone through the exhaust apertures.

OVJP deposition techniques as disclosed herein may be used to deposit a charge transport layer or other non-emissive layer over a substrate instead of, or in addition to, emissive layers. Near total isolation between the printed and non-printed regions of the substrate can be achieved with DEC OVJP to prevent overspray into adjacent subpixels. Such a high level of control may not be necessary if the deposited layer is common to all devices on the substrate. A degree of convective control, however, may be desirable to achieve a desired line size and profile.

Figure 8A:
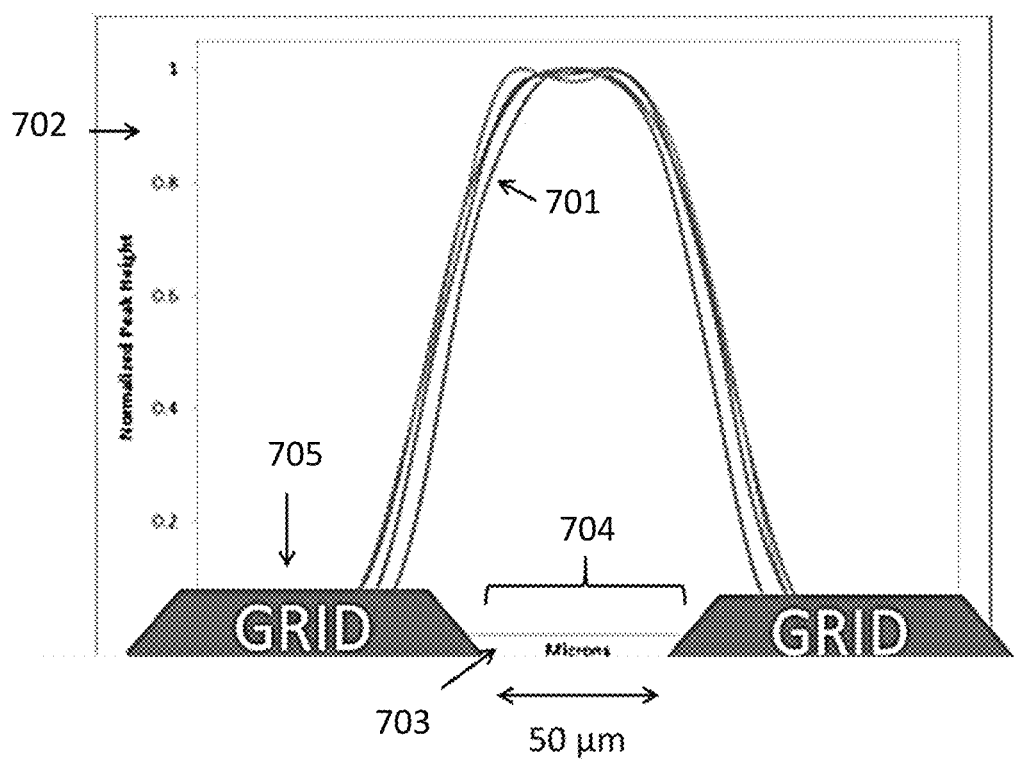
FIGS. 8A-8B show the thickness cross sections of organic thin film features printed by OVJP according to embodiments disclosed herein.
Figure 8B:
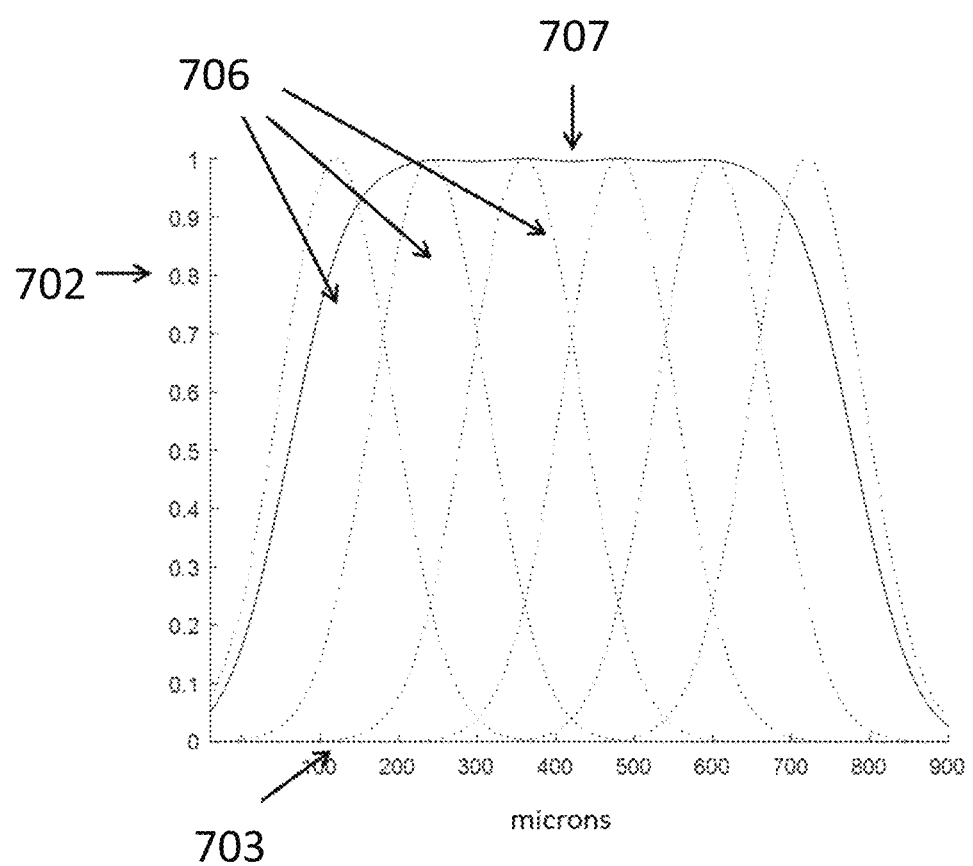

Mesa-like line profiles such as shown in FIG. 8A may be generated by depositor designs such as those disclosed in U.S. Patent Application Pub. No. 2017/0294615, the disclosure of which is incorporated by reference in its entirety. FIG. 8A shows profilometry traces 701 for several lines printed under different process conditions. The vertical axis 702 shows normalized feature thickness and the horizontal axis indicates offset from the center of the line 703. The targeted printing zone is an active area 704 between two regions of dielectric grid 705 that define the boundaries between subpixels in an OLED display. The target zone is 50 μm wide in this example, though other dimensions may be used. Line profiles range from near-Gaussian to approximately mesa-shaped depending on process conditions. The flat top of the mesa preferably should be as wide as the active area and the tails of the printed profile should not extend beyond the grid into the active area of a neighboring device. Blanket films of uniform thickness may be approximated by rastering the nozzles to generating overlapping lines as illustrated in FIG. 8B. In this example, individual Gaussian deposition profiles (dashed lines) 706 sum to form a film (solid line) 708.

The material utilization efficiency $\eta$ of the OVJP process has a strong negative dependence on both fly height and the ratio of exhaust to delivery flow QEvQD. Utilization efficiency can vary by 1%/μm or more with fly height. Since $\eta$ is linearly related to the thickness of printed lines, controlling the thickness of printed lines to within ±1% generally requires the fly height to be controlled to within ±1 μm between each depositor of an entire depositor array and the substrate. This is challenging for long depositor arrays since topographical features on the substrate may be present on the substrate between the locations of either the proximity sensors or actuator linkages on the print head.

In embodiments disclosed herein, it is advantageous to distinguish between average fly height and local fly height. The average fly height of a depositor system as disclosed herein refers to the average separation between each depositor and the substrate. It is typically the set point of the fly height control mechanism. The local fly height as used herein refers to the actual distance between each depositor and the substrate and varies by depositor across a micronozzle array subject to the tolerances of the substrate surface, micronozzle array, and fly height control mechanism. That is, a micronozzle array or equivalent depositor system as disclosed herein may include multiple DEC-type depositors as disclosed herein, each of which may include deposition, exhaust, and confinement apertures and gas flows. In some embodiments, adjacent deposition apertures may share intervening exhaust and/or confinement apertures and gas flows as previously disclosed.

Figure 9A:
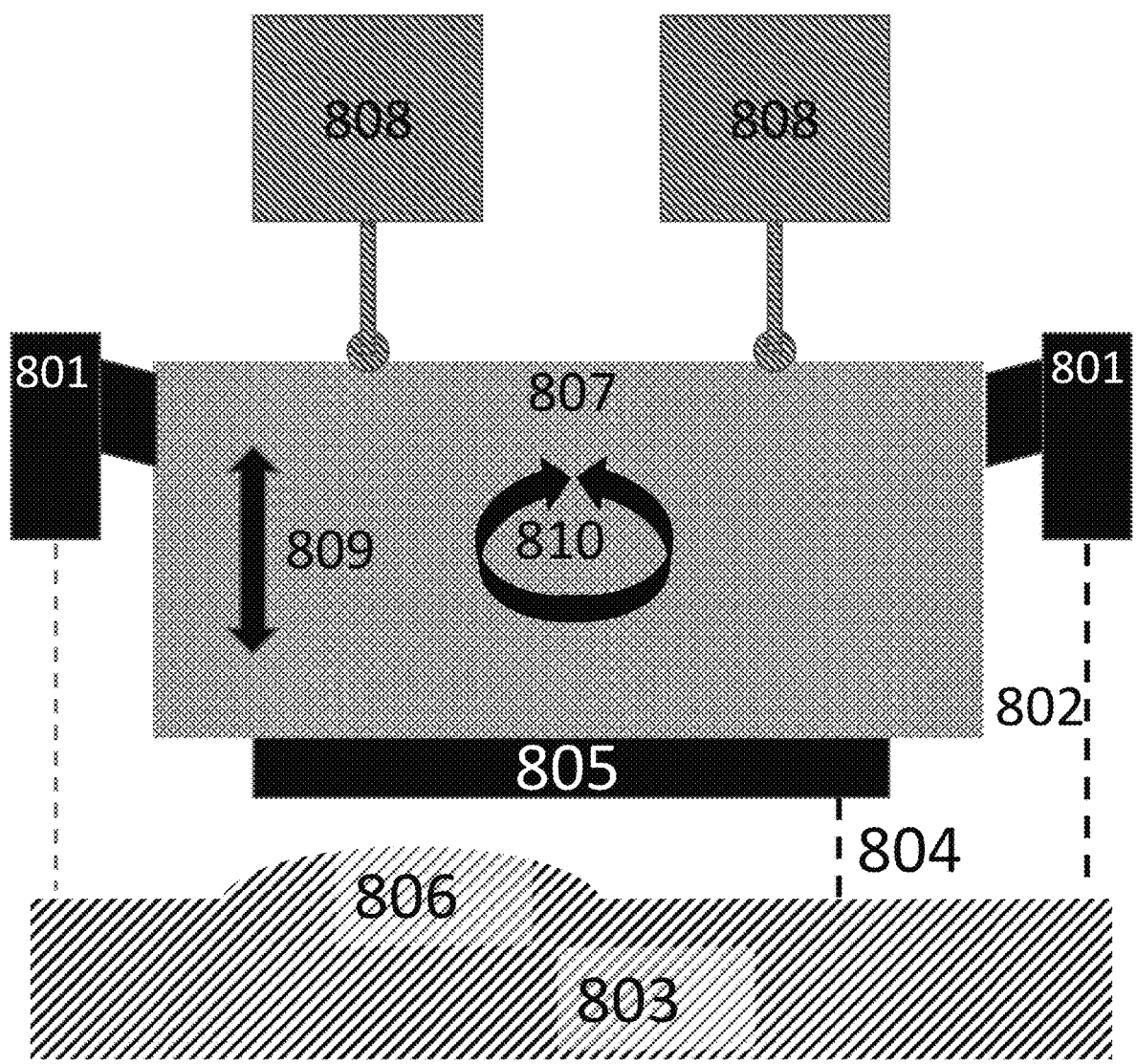
FIG. 9A shows an example of sensors and actuators that control the position of an OVJP print head relative to a substrate surface and the presence of a topographical irregularity on the substrate underneath the print head that is outside of the view of the sensors according to embodiments disclosed herein.

An example scenario in which average and local fly heights may differ is depicted in FIG. 9A. Sensors 801 monitor their distance 802 to the surface of a substrate 803 so an average fly height separation 804 between the substrate and micronozzle array 805 remain as constant as possible during a printing operation. If a hillock 806 is present on the substrate between the fields of view of the sensors, it cannot be detected and the micronozzle array will not move in response. The presence of the hillock will reduce the local fly height of the depositors on the micronozzle array opposing it. Likewise, the print head 807 carrying the micronozzle array is a rigid body with motion governed by actuators 808. The print head can either move vertically with respect to the substrate 809 or rotate relative to the substrate 810 to maintain a constant distance between each sensor and the substrate. The width of the print head therefore limits the spatial resolution with which the face of the micronozzle array can be conformed to the substrate topography, even if all the substrate surface features are known. The print head can maintain an average fly height over the substrate surface and an orientation normal to it, but it cannot individually control the local fly heights of individual depositors in the micronozzle array. The accuracy to which local fly height across a micronozzle array may made to conform an average fly height set point may therefore limited to ±3-5 μm in some embodiments, even under ideal conditions.

Figure 9B:
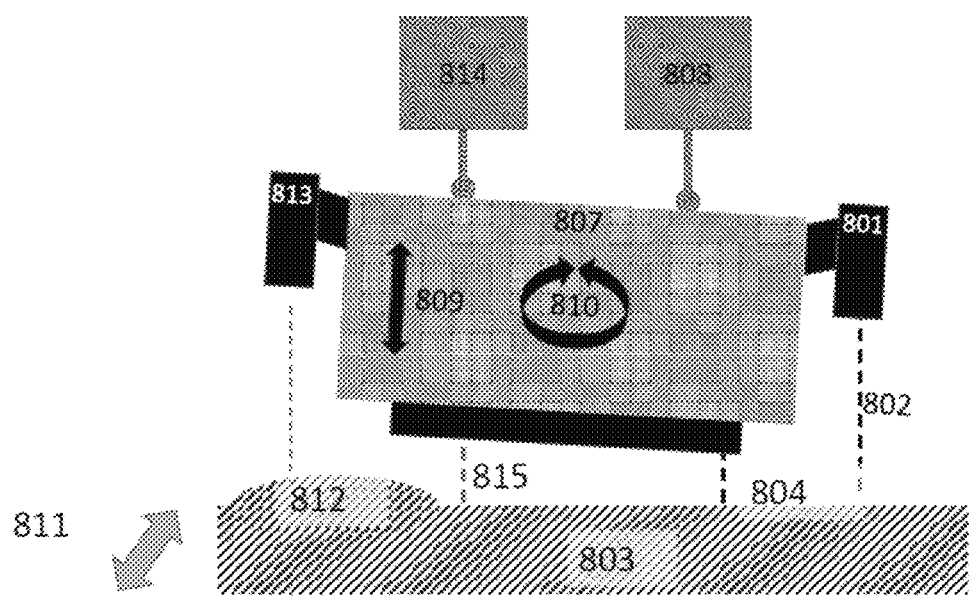
FIG. 9B shows an example of sensors and actuators that control the position of an OVJP print head relative to a substrate surface and a topographical irregularity on the substrate encountered by the print head as the substrate moves relative to it during a printing pass according to embodiments disclosed herein.

The motion of the substrate relative to the print head further complicates the problem of accurately controlling fly height. For example, as illustrated in FIG. 9B, the motion of the substrate 811 may move a hillock 812 underneath the print head and micronozzle array. The hillock may be detected by a sensor 813 and actuator 814 raises the print head rises to maintain constant separation between the sensor and the substrate. Local fly height is incorrect at the end of the die near the hillock 815 but is correct at the opposite end of the die 804.

The challenge of maintaining an accurate local fly height separation between each depositor of a micronozzle array and the substrate may be mitigated by increasing the deviation between local and average fly height that may be tolerated. The OVJP depositor design disclosed herein reduces the sensitivity of the deposition rate of each depositor to its local fly height.

It is known that deposition rate decreases as fly height increases if the delivery and exhaust flows is constant. This is because the utilization efficiency η of the depositor decreases in an approximately linear manner with increasing fly height. This principle is further described in US Patent Application Pub. No. 2015/0380648, the disclosure of which is incorporated by reference in its entirety, where fly height control is described as a method to initiate and pause material deposition. Material will only adhere to the substrate when the OVJP depositor is in proximity to it, so printing may be paused by moving the depositor away from the substrate in the substrate normal direction. When the depositor sufficiently far from the substrate, the utilization efficiency approaches zero. It is also known that deposition rate increases as the delivery gas flow increases. Greater delivery flow results in more material being introduced to the deposition zone, so more will deposit if η is held constant. Therefore, if the delivery gas flow can be automatically increased as the fly height for a depositor increases, this will create compensating effects. Reduced η with greater fly height will decrease deposition, while increased delivery flow will increase deposition.

These two effects may stabilize deposition rate with respect to local fly height over a given window. A decrease in the sensitivity of deposition rate to local fly height variation may not only increase the tolerance permissible between local fly heights and the average fly height but it may also reduce the precision to which a print head positioning system must hold to an average fly height set point. Decreasing the sensitivity of deposition rate to local fly height therefore facilitates a stable printing process.

Figure 10:
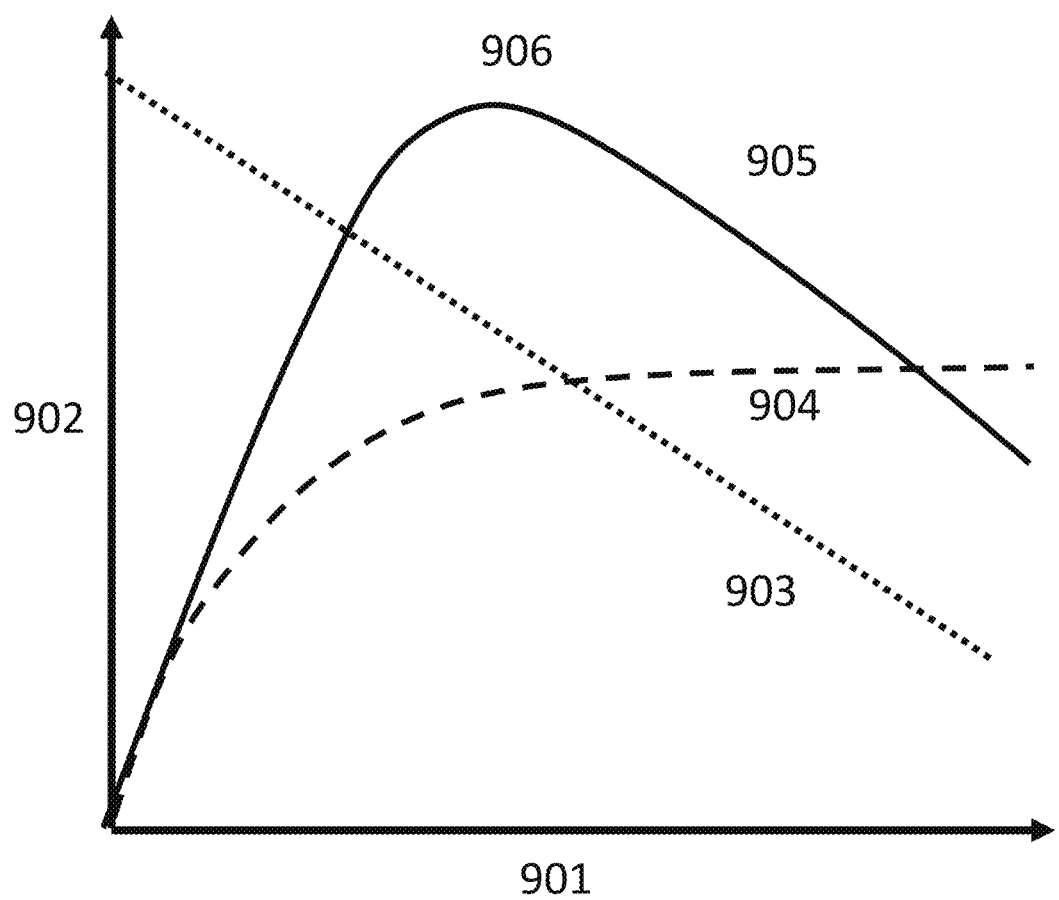
FIG. 10 shows trends in the delivery gas flow rate, organic vapor utilization efficiency, and deposition rate as a function of distance between the depositor and the substrate surface for depositor designs disclosed herein.

This principle is illustrated FIG. 10. The horizontal axis 901 indicates the clearance between the depositor at its closest point and the substrate. Note that since the depositor designs discussed in the following are not flat, it is more accurate to describe their performance as a function of position relative to the substrate in terms of a clearance between the substrate and prominences on the depositor rather than a local fly height separating the substrate and the main or average surface of the depositor. The vertical axis 902 may indicate utilization efficiency η, delivery flow rate, or deposition rate as follows. The dotted line 903 indicates η (fraction of organic material impinging on the surface of the substrate and not collected by the exhaust apertures) as a function of clearance and the dashed curve 904 indicates the delivery gas flow from a depositor designed so that delivery flow varies with clearance. The effect of these two curves on the deposition rate is approximately multiplicative. When the delivery gas flow is nearly zero, no organic vapor is available, so the deposition rate is zero. As clearance increases, delivery gas flow increases but the depositor is sufficiently close to the substrate that organic vapor condenses efficiently on it, leading to an increase in deposition rate. As clearance increases further, the flow of delivery gas approaches an asymptotic limit, while the utilization efficiency continues to decrease. This leads to a decrease in deposition rate. The solid curve 905 shows the behavior of deposition rate vs. clearance. The deposition rate passes through a maximum 906. The clearance at which this maximum occurs is the optimal clearance for operating the depositor, both because the deposition rate is maximized and because the sensitivity of deposition rate to changes in clearance or fly height is minimized. Operating at this optimal clearance will lead to maximally stable printing and minimize the consequences of uncertainties about the actual fly height beneath individual depositors of an array.

Figure 11A:
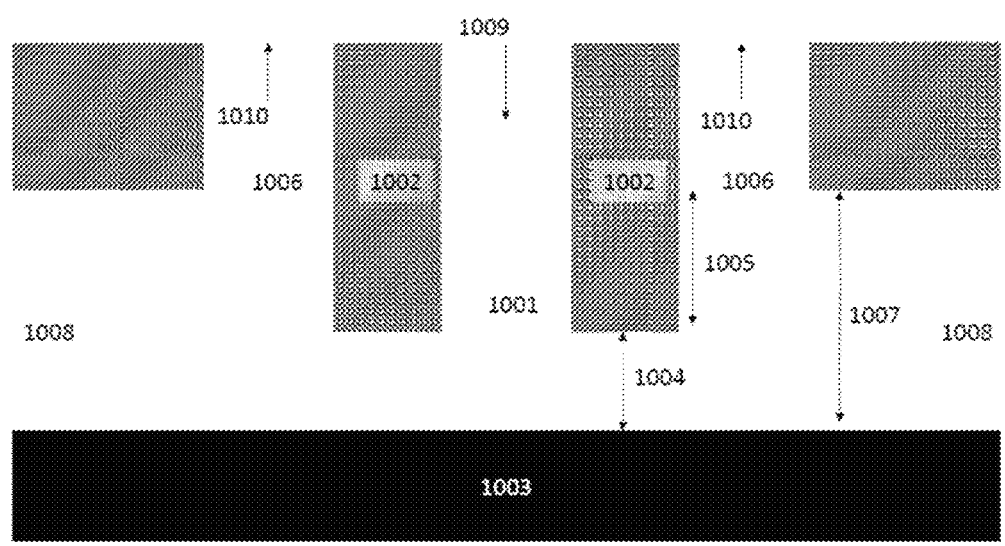
FIG. 11A shows a cross sectional illustration of an OVJP depositor according to embodiments disclosed herein, which may permit the increase of delivery gas flow rate as separation between the depositor and substrate increases.

A depositor for which delivery gas flow increases with fly height is illustrated in cross section in FIG. 11A. A delivery aperture 1001 is surrounded by two delivery-exhaust (DE) spacers 1002 which protrude beyond the surrounding depositor face. The distance between the tips of the DE spacers and the substrate 1003 is referred to as the clearance c 1004. The DE spacers may act as a dam that regulates the flow of gas from the delivery to the exhaust apertures, thereby providing for self-regulation of gas flow in the disclosed depositor. The prominence of these features above the rest of the depositors is referred to as the dam height or distance s 1005. On the far side of each DE spacer is an exhaust aperture 1006, surrounded by the bottom surface of the depositor. This surface is separated from the substrate by the previously defined local fly height g 707, such that g>c and c+s=g. Confinement gas enters from reservoirs to the sides 1008 of the depositor as depicted. A delivery gas flow 1009 laden with organic vapor from evaporation sources is ejected from the delivery aperture onto the substrate at constant pressure, while an exhaust flow 1010 is withdrawn from the substrate area by the exhaust apertures at constant flow rate.

When the depositor is in proximity to the substrate, the gap of clearance c 1004 between the DE spacers and the substrate creates a high impedance flow path between the delivery and exhaust apertures. A constant pressure delivery flow is choked off by the high impedance and only a relatively small mass flow of delivery gas travels over the substrate and into the exhaust apertures. When the depositor is raised from the substrate, the impedance of the delivery to exhaust aperture flow path decreases and a greater mass flow of delivery gas laden with organic vapor passes over the substrate and into the exhaust aperture. The increase in mass flow of delivery gas is offset by the reduction in deposition efficiency for increasing clearance.

Figure 11B:
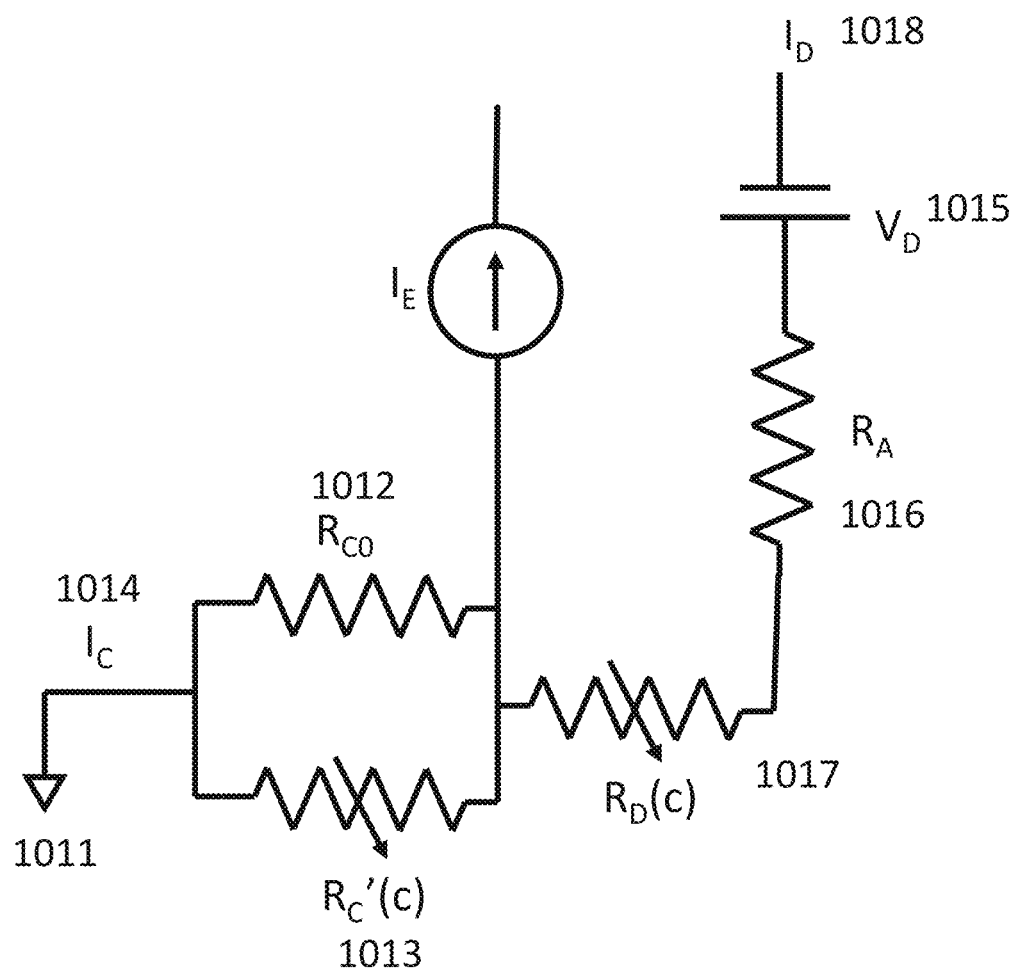
FIG. 11B shows an OVJP depositor according to embodiments disclosed herein, which may permit the increase of delivery gas flow rate as separation between the depositor and substrate increases represented as an analogous electronic circuit, with currents and voltages representing volumetric flows and pressure differentials.

FIG. 11B shows an equivalent circuit model of this structure, using electric current as an analogue for fluid flow. The confinement gas starts at chamber pressure, represented in the model as ground 1011. Confinement gas flows through a constant conductance flow path set difference in prominence between the DE spacers and the rest of the depositor face represented by $R_{CO}$ 1012. Confinement gas may also flow through a variable conductance flow path represented by $R_C'(c)$ 1013 that opens as c increases. This gives a total resistance of $R_C(c) = (1/R_{CO} + 1/R_C'(c))^{-1}$. The mass flow of confinement gas into the exhaust aperture is analogous to the current measurement $l_c$ 1014. The constant pressure delivery gas source is represented by the constant voltage source 1015 generating $V_D$. The conductance of the flow path between the delivery and exhaust apertures around the DE spacers is represented by fixed resistor $R_A$ 1016 in series with a variable resistor $R_D(c)$ 1017. The flow path through $R_D$ is initially closed but opens as c increases. Current $l_D$ 1018 represents the mass flow of delivery gas into the exhaust aperture. Finally, a constant exhaust flow is represented by constant current source generating $l_E$. Solving for the $l_D$ in this equivalent circuit, one gets the following.

$$I_D = \frac{V_D + |I_E|R_c}{R_A + R_D + R_c}$$

Converting this model back fluid mechanical terms, the volumetric flow of delivery gas QDV and the volumetric flow of exhaust gas QEV are analogous to $l_D$ and $l_E$, respectively. The difference $\Delta P = P_D - P_C$ between delivery pressure $P_D$ and far-field chamber pressure $P_C$ is analogous to $V_D$. The resistances here represent the inverse of conductance to fluid flow. Conductance along the confinement gas flow path is $1/R_c(c) = A(s+c)^3$ where A is a constant and $s = g - c$ is the difference between the fly height g and the clearance c, so $R_{CO} = (As^3)^{-1}$ and $R_C'(c) = (Ac(3s^2+3sc+c^2))^{-1}$. The conductance of delivery gas underneath the delivery spacer is $Bc^3$ where B is a constant, so $R_D(c) = (Bc^3)^{-1}$.

The variable $x = c/s$ can be used to express a non-dimensional value for clearance in terms of the dam prominence s. Using the parallel plate flow equation, one finds that constants A and B equal $2w/(3 \mu l)$, where w and l are the width and length of their respective flow channels and $\mu$ is the dynamic viscosity of the gas. Assuming w is the same for both flow paths and $\mu$ is uniform throughout the flow field, one gets the expression below. Note that $R_A'$ is related to $R_A$ by a constant.

$$QDV = \frac{\frac{2w}{3\mu} s^3 (1+x)^3 x^3 \Delta P + QEV * l_C x^3}{R_A' s^3 (1+x)^3 x^3 + l_D (1+x)^3 + l_C x^3}$$

Figure 12:
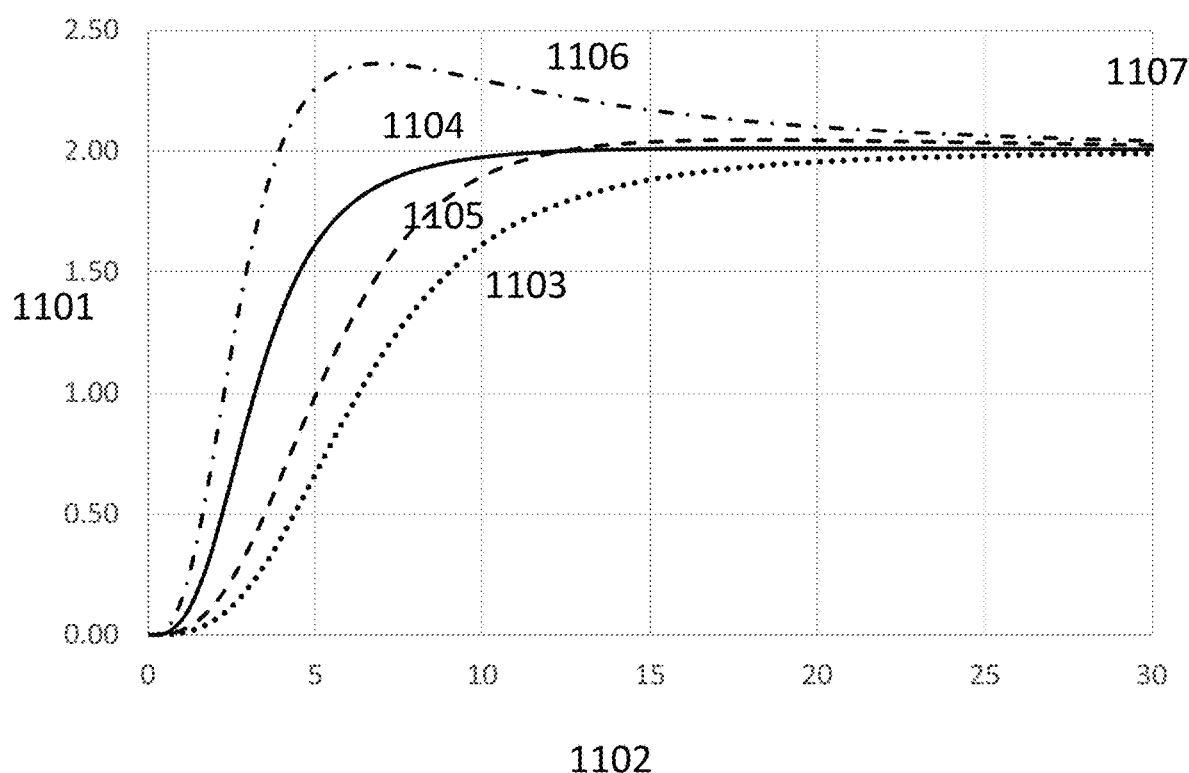
FIG. 12 shows delivery gas flow rates generated by different configurations a depositor according to embodiments disclosed herein, plotted as a function of clearance between the depositors and the substrate.

The above equation is used to plot delivery flow in standard cubic centimeters/min on the vertical axis 1101 of FIG. 12. Clearance c is plotted on the horizontal axis in microns 1102. The plot was generated assuming typical values for the OVJP process of w=500 μm, p=3×10$^{-5}$ Pa*s and volumetric flows are converted to mass flows for typical OVJP process conditions. The chamber pressure is $P_C$=200 Torr, the relative pressure of the delivery gas source is $\Delta P$=40 Torr, and the length of the confinement gas flow path is $l_C$=150 μm. The dotted line 1103 shows the case where dam prominence is s=30 μm and the length of the delivery gas flow path is $l_D$=75 μm. The solid line 1104 shows the case where s=30 μm and $l_D$=25 μm. The dashed line 1105 shows the case where s=10 μm and $l_D$=75 μm. Finally, the dashed and dotted line 1106 shows the case where s=10 μm and $l_D$=25 μm. As these examples show, $l_D$ affects the horizontal axis scaling of delivery flow. Smaller values of $l_D$ cause larger changes in delivery flow for a given change in clearance. The magnitude of dam prominence s has a similar effect, with smaller prominences producing larger changes in delivery flow per change in clearance. In most cases, the delivery flow monotonically increases to a limiting value that depends on the properties of the delivery gas, the delivery pressure, and the conductance of the delivery aperture. The combination of small s=10 μm and $l_D$=25 μm creates very abrupt rise in delivery flow with clearance at low clearance, but overshoots the limiting value, leading to non-monotonic behavior. This is due to vacuum from the exhaust aperture increasing the flow of delivery gas due to the relatively low impedance of the flow path between them. Stable regulation of delivery gas flow by the dam requires a combination of delivery gas flow path length and dam prominence that create a much more resistive delivery gas flow path than the confinement flow path at low clearance.

Figure 13A:
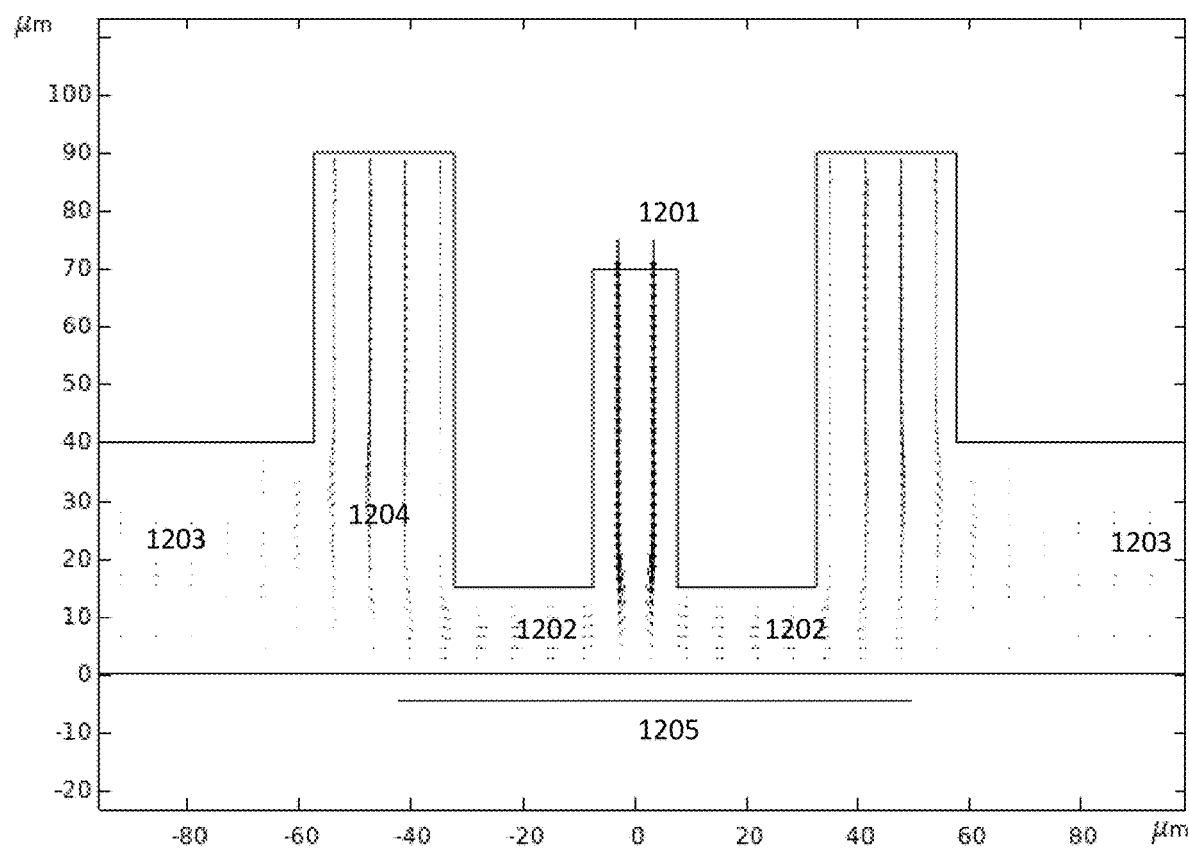
FIG. 13A shows a vector plot of flow fields generated by a depositor as disclosed herein.

A more detailed model of this system was generated using COMSOL Multiphysics on a geometry like that of shown in FIG. 13A. The flow field generated is shown in FIG. 13A as a vector plot through cross section of the depositor. The flow of delivery gas 1201 is ejected from the delivery aperture and passes through a restriction with height c 1202 between the substrate and each of the DE spacers as it flows to the exhaust apertures on either side. The outward flow of delivery gas is opposed by an inward flow of confinement gas 1202 drawn from the sides of the depositor. The two gas flows combine 1204 and flow upward and out through the exhaust aperture. Organic material is deposited on the width of the substrate covered by the delivery flow 1205. This width lies between the intersections of the delivery and confinement flows on the left an and right sides.

Figure 13B:
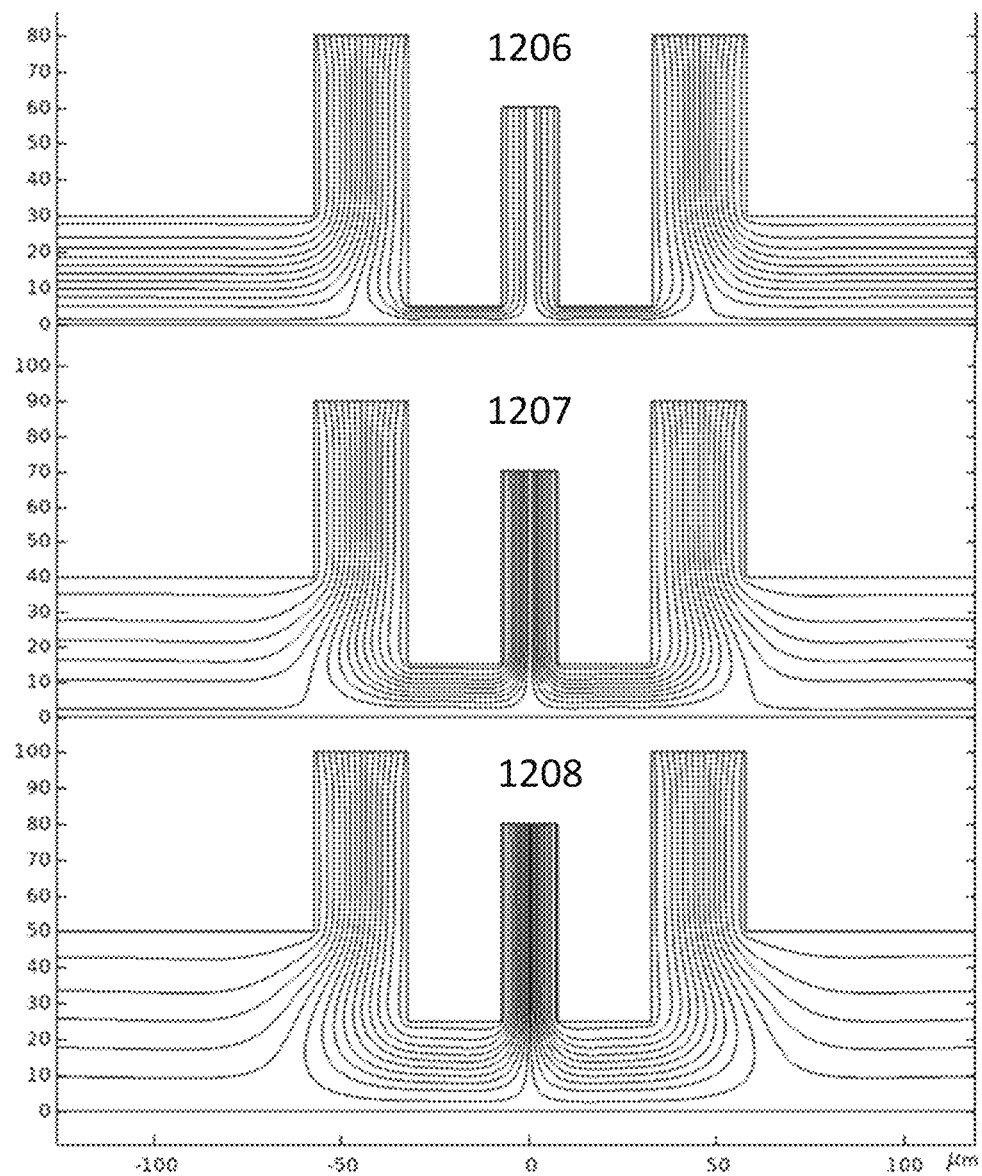
FIGS. 13B and 13C show streamlines of the flow fields generated by two depositor designs according to embodiments disclosed herein, and tracks their changes as clearance between the depositor and substrate increases.
Figure 13C:
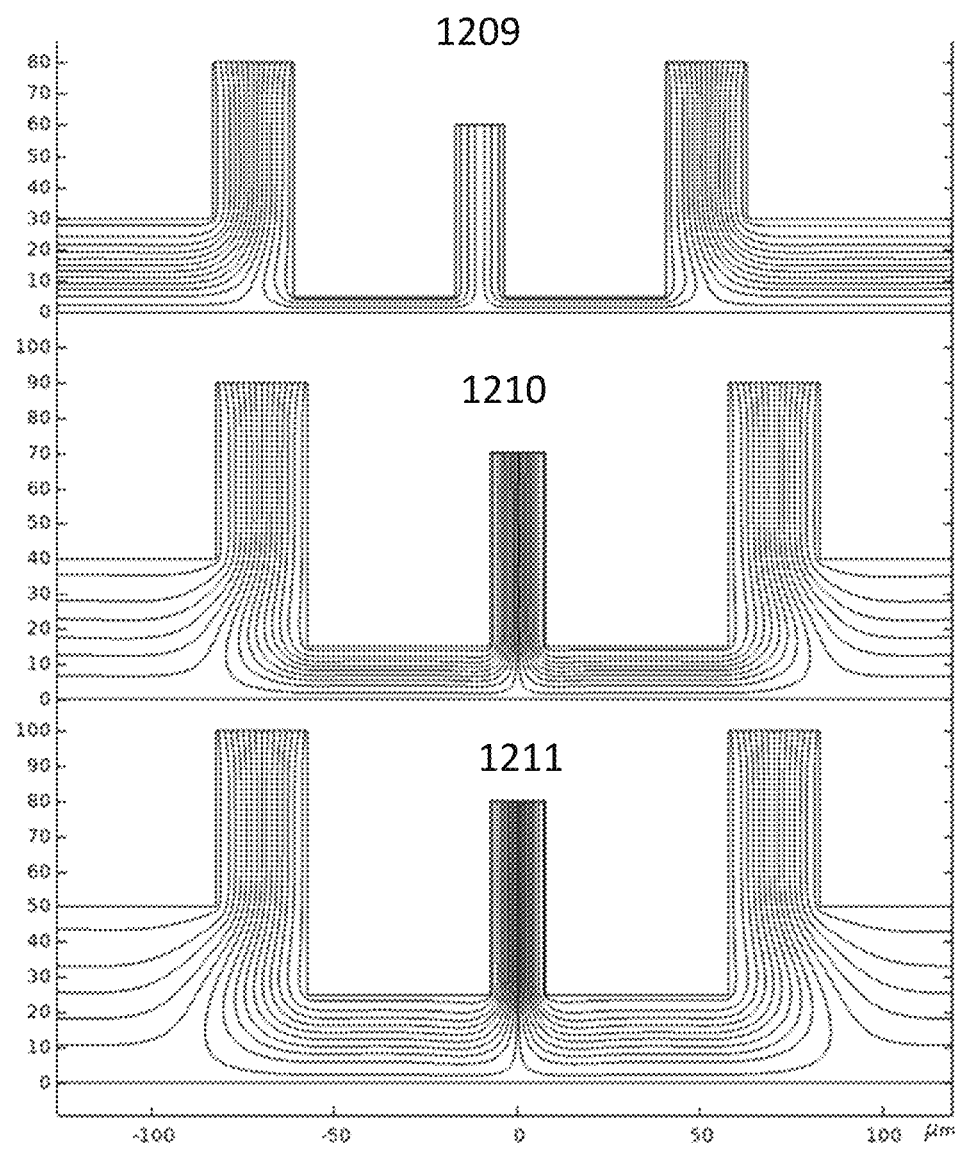

FIGS. 13B and 13C show changes in streamlines of flow as a depositor is moved from a clearance of c=5 μm 1206, to c=15 μm 1207, to c=25 μm 1208 for DE spacers of 25 μm in width. The same progression is also shown for a depositor with DE spacers of 50 μm in width for c=5 μm 1209, to c=15 μm 1210, to c=25 μm 1211. The number of streamlines originating from the delivery channel increases with each movement away from the substrate, indicating an increase in delivery flow with increasing clearance. In both cases, the delivery flow increases rapidly from c=5 μm to c=15 μm. The flow is less at c=5 μm in the DE=50 μm case, with 6 streamlines, than it is for the DE=25 μm case with 8 streamlines. This is also true at c=15 μm, with the DE=25 μm case having 18 streamlines and the DE=50 μm case having 16 streamlines. Both the DE=25 and DE=50 μm cases have 20 streamlines of delivery flow at c=25 μm. The DE=25 and DE=50 become equivalent at higher clearances, since the delivery flow becomes limited by the conductance of the delivery aperture rather than the path of delivery flow to the exhaust aperture. Note as well that the DE=25 μm case approaches this limiting value more quickly than the DE=50 μm case.

Figure 14A:
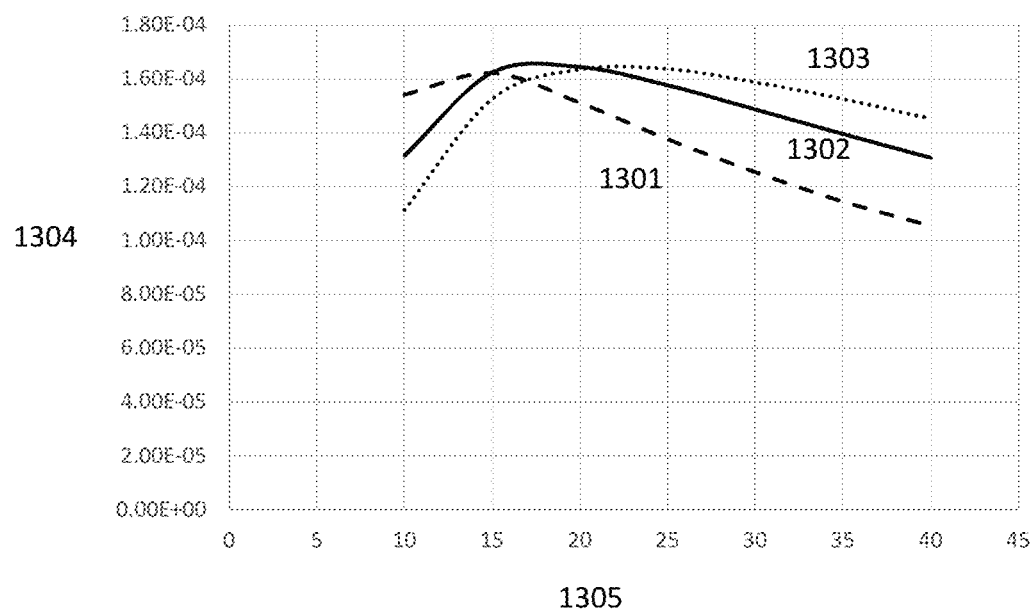
FIG. 14A shows organic material deposition rate plotted as a function of clearance with the substrate for depositors according to embodiments disclosed herein, which vary the length of the flow path between delivery and exhaust apertures.
Figure 14B:
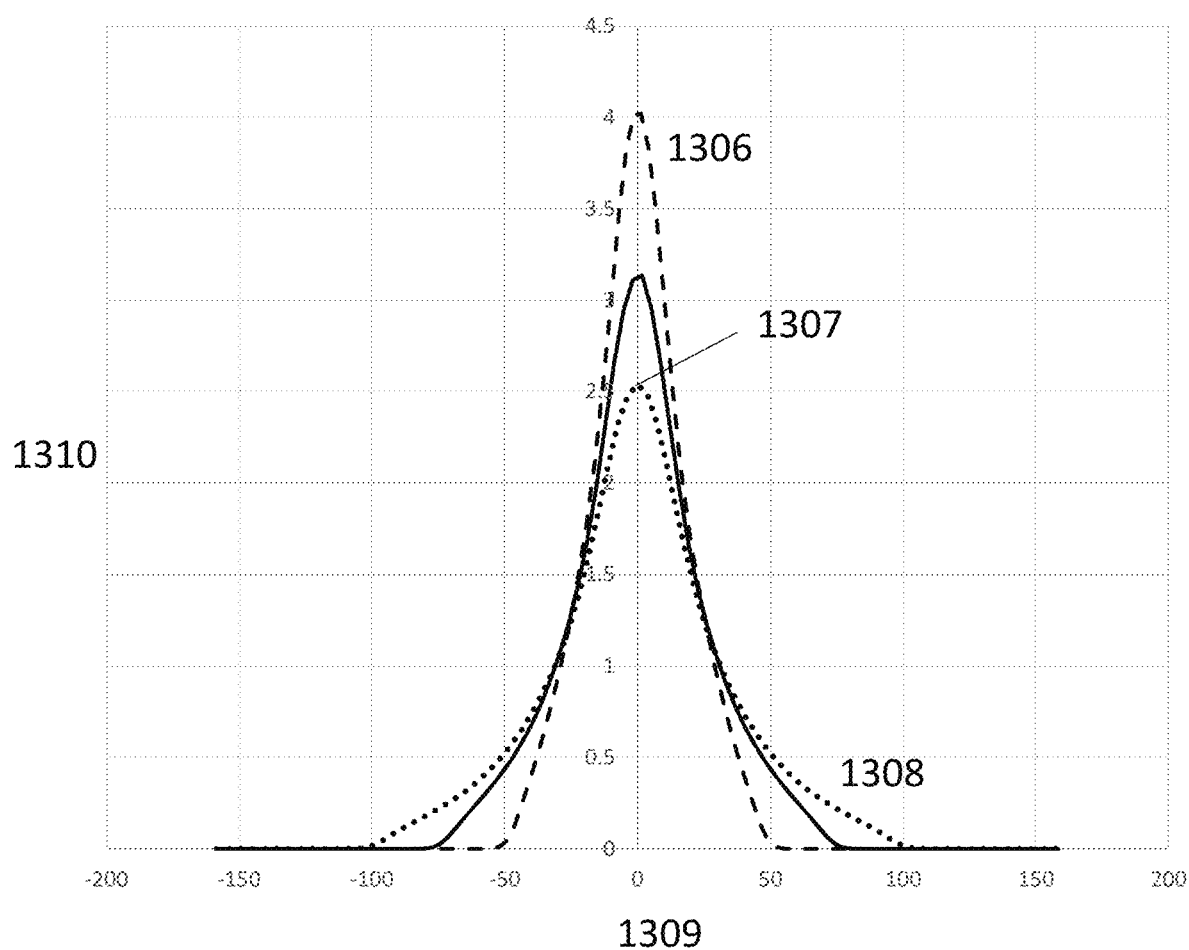
FIG. 14B shows thickness profiles of features printed by according to depositor embodiments disclosed herein, which vary the flow path between delivery and exhaust apertures.

Deposition rates are plotted for a depositor with dam prominence s=30 μm and DE spacer widths DE=25 μm 1301 with a dashed line, DE=50 μm 1302 with a solid line, and DE=75 μm 1303 with a dotted line in FIG. 14A. The vertical axis 1304 gives deposition rate in arbitrary units and the horizontal axis 1305 gives clearance c in microns. Increasing the DE spacer width and therefore the gas flow path $l_D$ increases the clearance at which maximum deposition rate and therefore maximum deposition rate stability is achieved. Greater $l_D$ also flattens the deposition rate curve overall, increasing deposition rate stability. Both are desirable since they lead to a more controllable deposition process. However, adding length to the delivery gas flow path $l_D$ can adversely affect feature size. FIG. 14B plots the thickness profile for features printed by a depositor with DE=25 μm at c=15 μm with a dashed line 1306, with DE=50 μm at c=20 μm with a solid line 1307, and with DE=75 μm at c=25 μm with a dotted line 1308. Clearances were chosen to approximate the positions of the deposition rate maxima in FIG. 14A. Modeled normalized deposition rate per unit area is plotted on the vertical axis 1309 in arbitrary units, while position relative to the depositor centerline is plotted on the horizontal axis 1310 in microns. As the width of the DE spacer is increased, the feature width increases from 100 to 200 μm. Wide DE spacers may be unsuitable for printing applications requiring fine features.

Figure 14C:
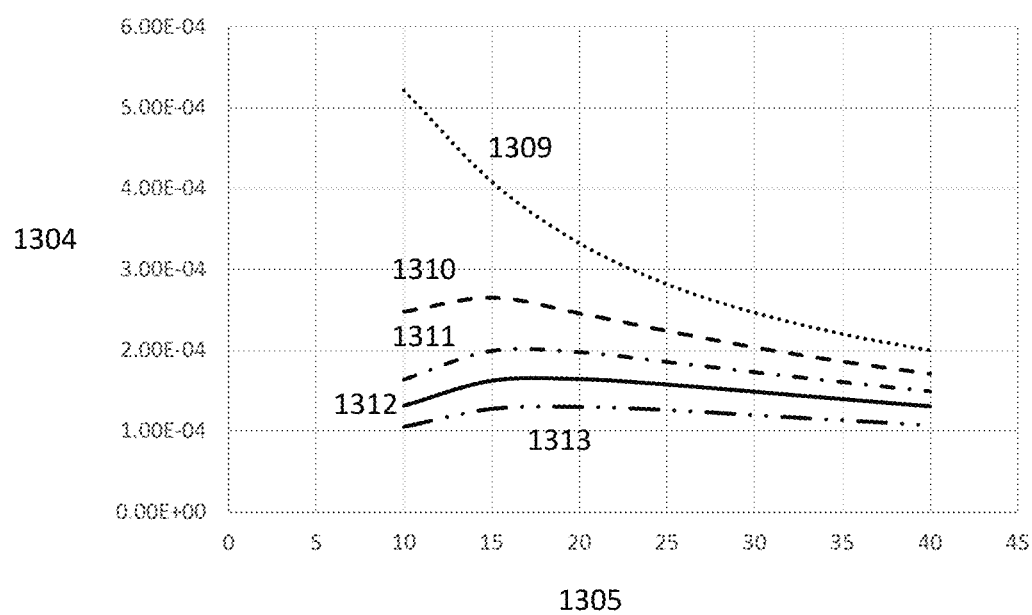
FIG. 14C shows organic material deposition rate plotted as a function of clearance with the substrate for depositor according to embodiments disclosed herein that vary the prominence of the dams separating delivery and exhaust apertures.

Deposition rates for a set of depositors with DE=50 μm are plotted in FIG. 14C as a function of clearance c for a multiple dam prominences s. Horizontal and vertical axes are the same as in FIG. 14A. The dotted line 1309 plots the case of s=0. Note that deposition rate is monotonically decreasing with clearance, so there is no finite clearance at which deposition stability is optimal. The dashed line 1310 shows the case of s=10 μm, the dot-dash line 1311 shows the case of s=20 μm, the solid line 1312 shows the case of s=30 μm, finally, the double-dot-dash line 1313 shows the case of s=45 μm. As dam prominence s increases, the overall deposition rate decreases, but the curve flattens and the clearance at which deposition rate is maximized increases. Depositors with prominent dams have lower deposition rates but those deposition rates are more stable with regard to fly height fluctuations. Depositors with prominent dams can also be operated with greater clearance between the depositor and substrate. Note, however, that high dam prominence has diminishing returns. Increasing s from 30 to 45 μm does not increase optimal clearance, but it decreases deposition rate.

Figure 14D:
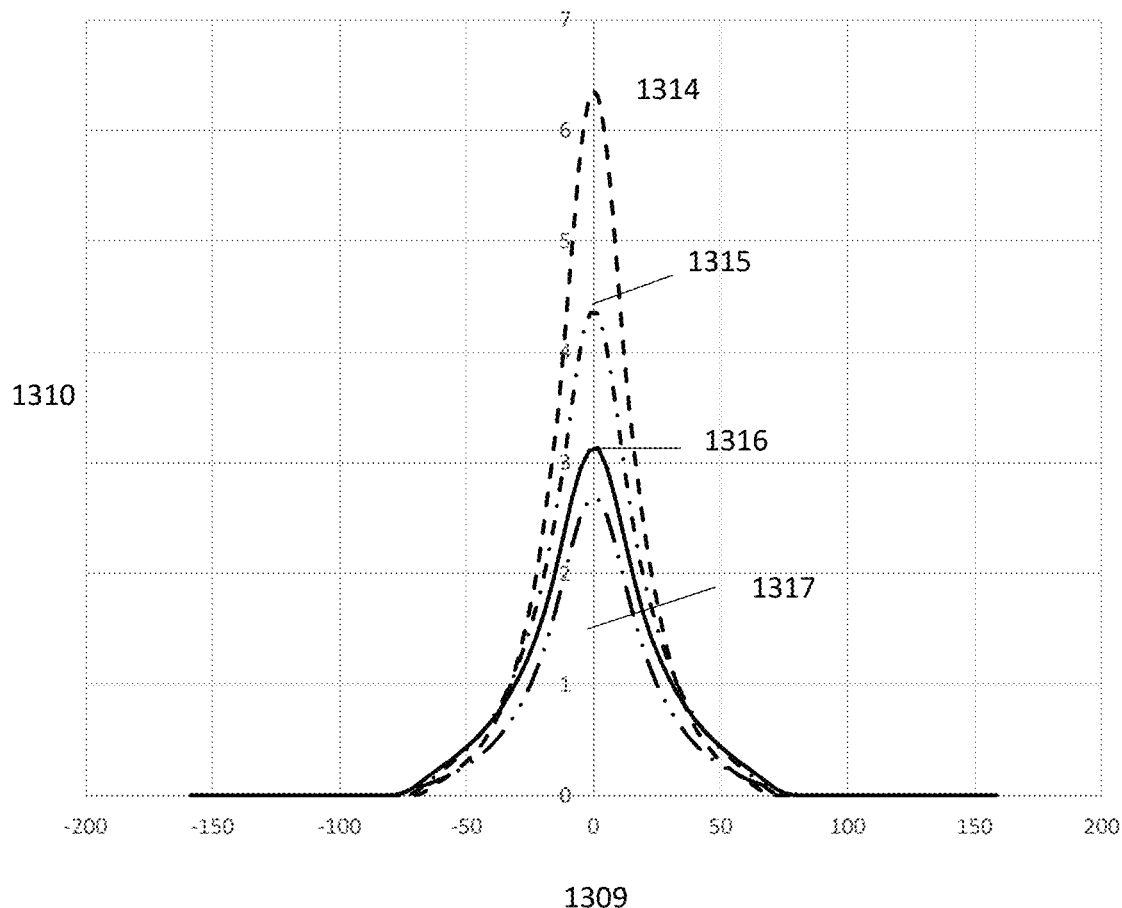
FIG. 14D shows thickness profiles of features printed by depositor according to embodiments disclosed herein that vary the prominence of the dams separating delivery and exhaust apertures.

The deposition profile generated by each depositor at its optimal clearance is plotted in FIG. 14D. The dashed line 1314 shows the case of s=10 μm and c=10 μm, the dot-dash line 1315 shows the case of s=20 μm and c=15 μm, the solid line 1316 shows the case of s=30 μm c=20 μm, finally, the double-dot-dash line 1017 shows the case of s=45 and c=20 μm. Axes are the same as in FIG. 14B. While deposition rate slows, and the deposition shape changes somewhat, the overall width of the printed feature remains roughly constant at 150 μm.

Rules for designing an optimal depositor can be inferred from these trends. The delivery gas flow path $l_D$ and therefore DE should be made as wide as the feature sizes required for a given printing application will permit. Once the DE spacer is sized, the dam around the delivery aperture should be as prominent as is needed to provide an optimal deposition rate at a clearance that can be reliably maintained. The tolerance window with which a clearance can be maintained across a depositor array and the effect it has on deposition rate must also be considered when choosing s.

Figure 15A:
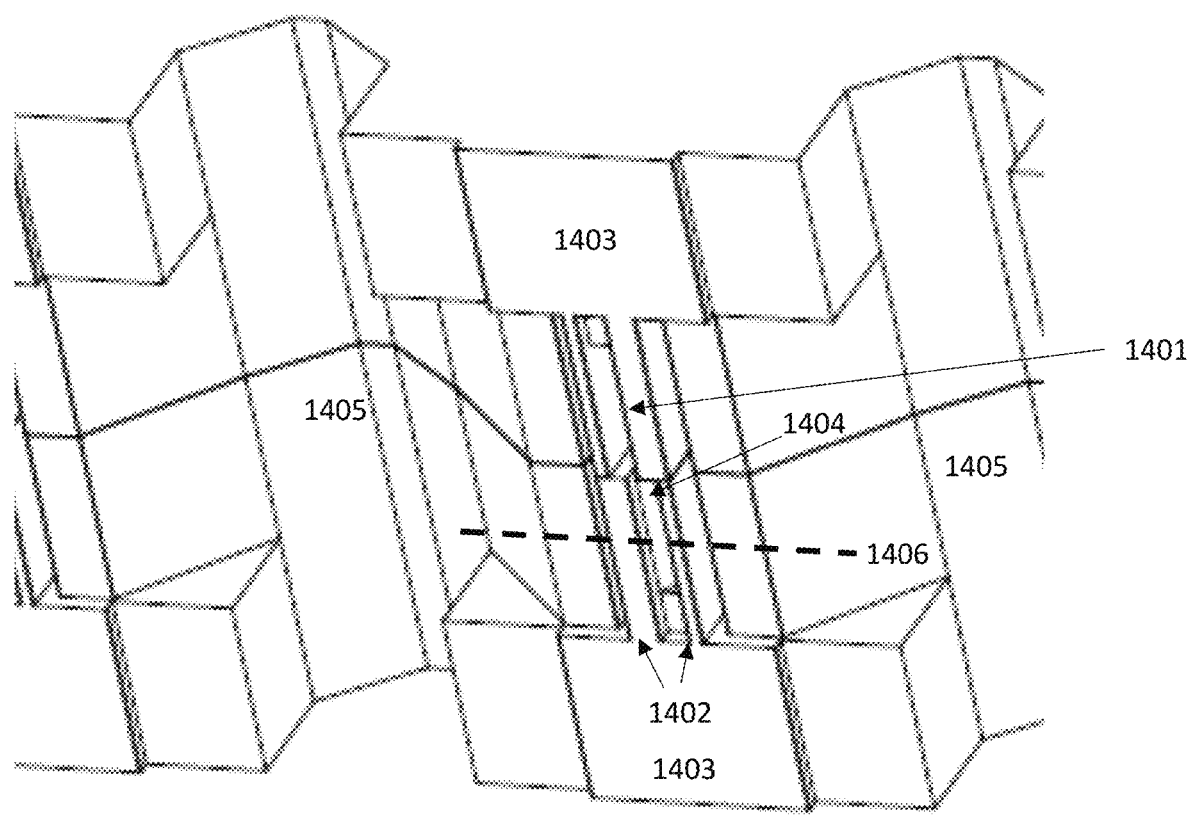
FIG. 15A shows an example surface of a depositor according to embodiments disclosed herein, which is designed to print features with a mesa-like thickness profile for improved flatness of a top surface and improved thickness uniformity, based on at least fly height changes over the active area of printed devices.
Figure 15B:
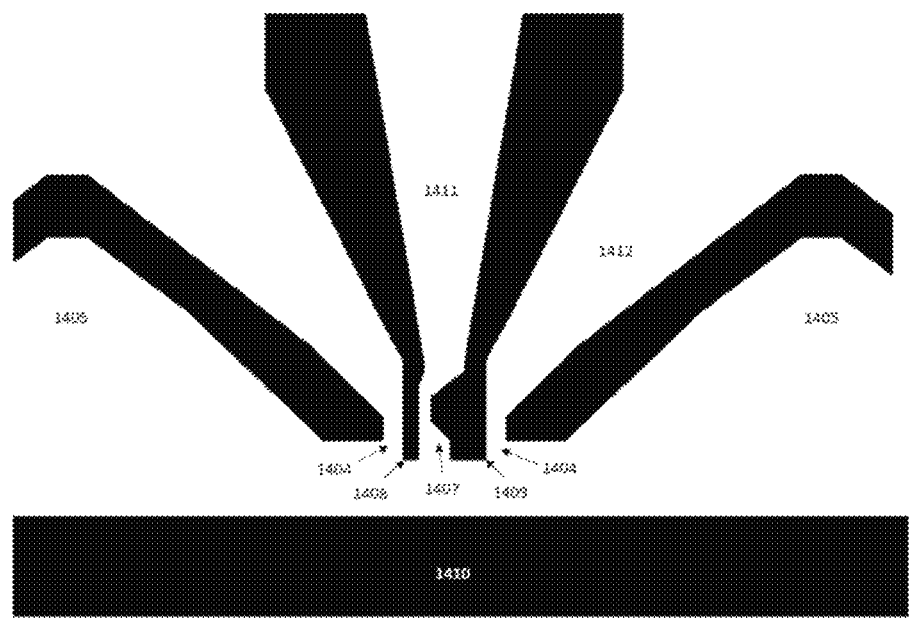
FIG. 15B shows a cross-sectional profile of a depositor according to embodiments disclosed herein, which is designed to print features with a mesa like thickness profile for better thickness uniformity over the active area of printed devices.

The flux-regulated ("self regulating") depositor concepts disclosed herein may be combined with other OVJP depositor design features, including those disclosed in US Patent Application Pub. Nos. 2017/0294615, 2019/0218655, and 2019/0221783, the disclosure of each of which is incorporated by reference in its entirety. An example of such a configuration is shown in FIG. 15A. This depositor features a delivery aperture 1401 split across its midsection and the two lengths are offset to generate a mesa-like profile compared with previous examples having a single delivery aperture. The delivery aperture also features a fillet on its inside surface to direct the flow of delivery gas. The delivery aperture is surrounded by a protruding dam 1402 comprised of DE spacers with two different widths due to the split in the delivery aperture. The dam contains 1403 sections adjacent to the front and rear edges of the delivery apertures to prevent delivery gas from escaping from the ends when the depositor is held in proximity to the substrate. The wide DE spacer, DE1, is generally 2 to 5× the width of the narrow DE spacer, DE2. The exhaust apertures 1404 are the same as in previous examples and the depositor is surrounded by cross-flow channels 1405 to promote the uniform distribution across the length of the depositor. A cross section line 1406 indicates the position of the feature cross section shown in FIG. 15B. The fillet in the delivery aperture 1407 is clear in this cross-sectional view, as are the narrow 1408 and wide 1409 DE spacers. In addition to the features indicated on the surface of the depositor, the cross section shows the position of the substrate 1410 relative to the depositor as well as the delivery channel 1411 that carries organic vapor and delivery gas from the sublimation sources to the delivery apertures as well as the exhaust channels 1412 that connect the exhaust apertures to a vacuum source.

Figure 15C:
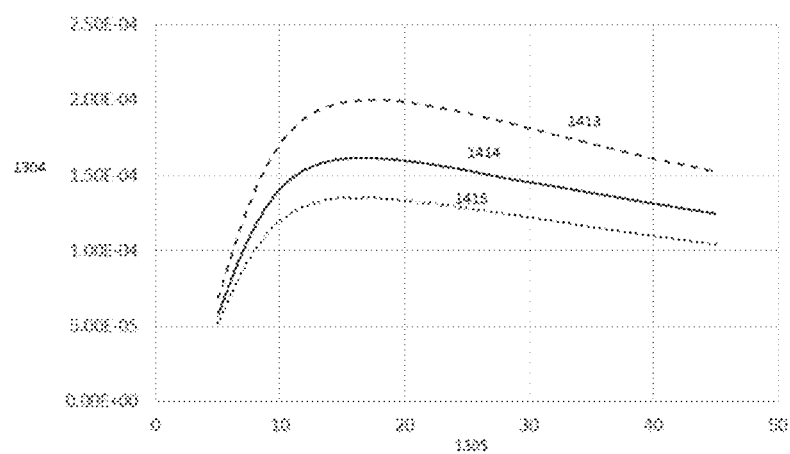
FIG. 15C shows organic material deposition rate plotted as a function of clearance with the substrate for a depositor according to embodiments disclosed herein designed to print features with a mesa like thickness profile.
Figure 15D:
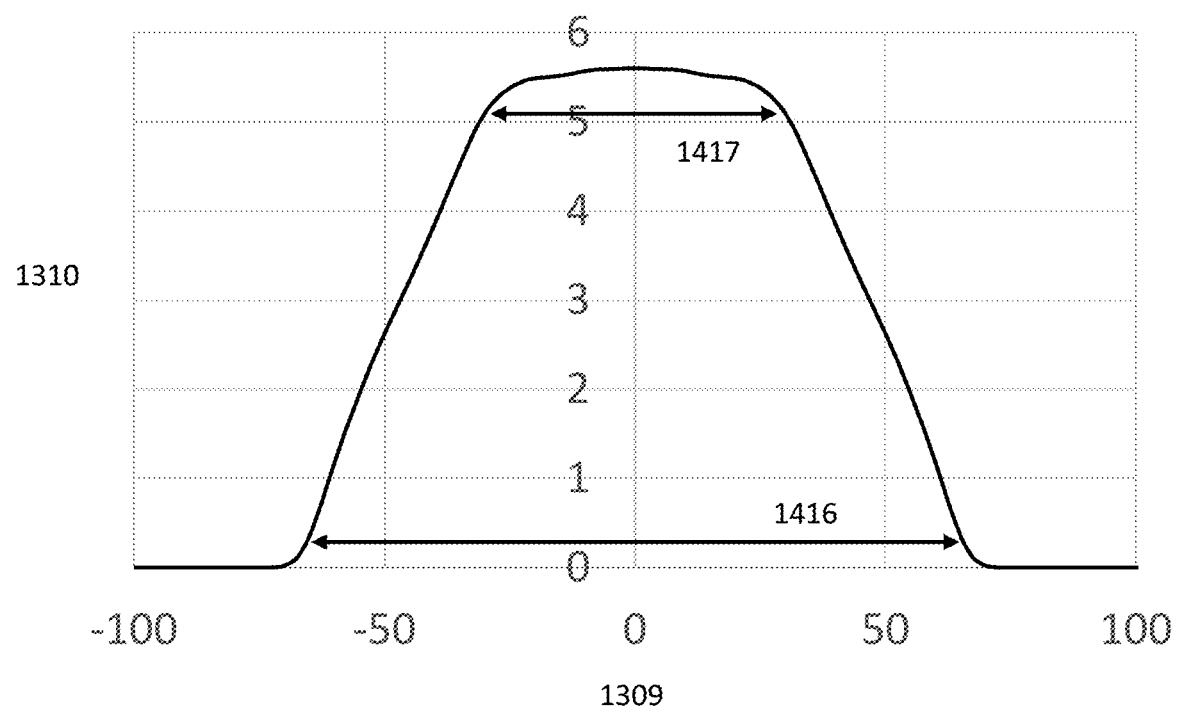
FIG. 15D shows the thickness profiles of features printed by a depositor according to embodiments disclosed herein, designed to print features with a mesa like thickness profile.

Deposition rates for a depositor of this design are shown in FIG. 15C. The narrow DE spacer DE1=20 μm and the wide DE spacer DE2=75 μm. Deposition rates for dam prominences of s=12.5 μm is plotted with a dashed line 1413, s=25 μm is plotted with a solid line 1414, s=37.5 μm is plotted with a dotted line 1415. Horizontal and vertical axes are the same as those in FIGS. 14A and 14C. The plot indicates clear maxima in deposition rate between c=10 and 20 μm in all cases. The feature printed by this depositor setting dam prominence to s=12.5 μm and clearance c=14 μm is plotted in FIG. 15D. The axes are the same in this plot as those in FIGS. 14B and 14D. The total width of the feature is 140 μm 1416, which is typical of the previous examples. The top of the profile, defined as the region over which film thickness varies by 10% or less, is 60 μm wide 1417. This width was much greater than in previous examples. Organic thin film devices require uniformity over their active area, so a top width that is a significant fraction of the overall feature width facilitates printing devices with a high fill factor. This depositor can print such profiles in a single pass, reducing TAKT time.

Figure 16A:
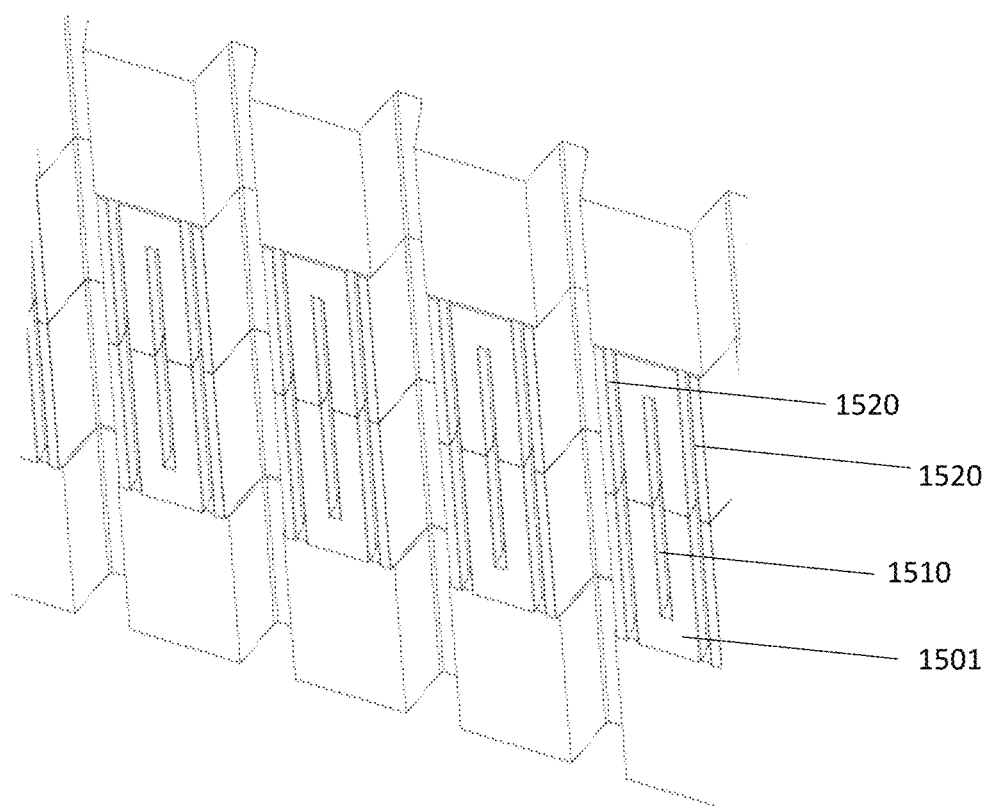
FIG. 16A shows an example of a DEC depositor as disclosed herein.
Figure 16B:
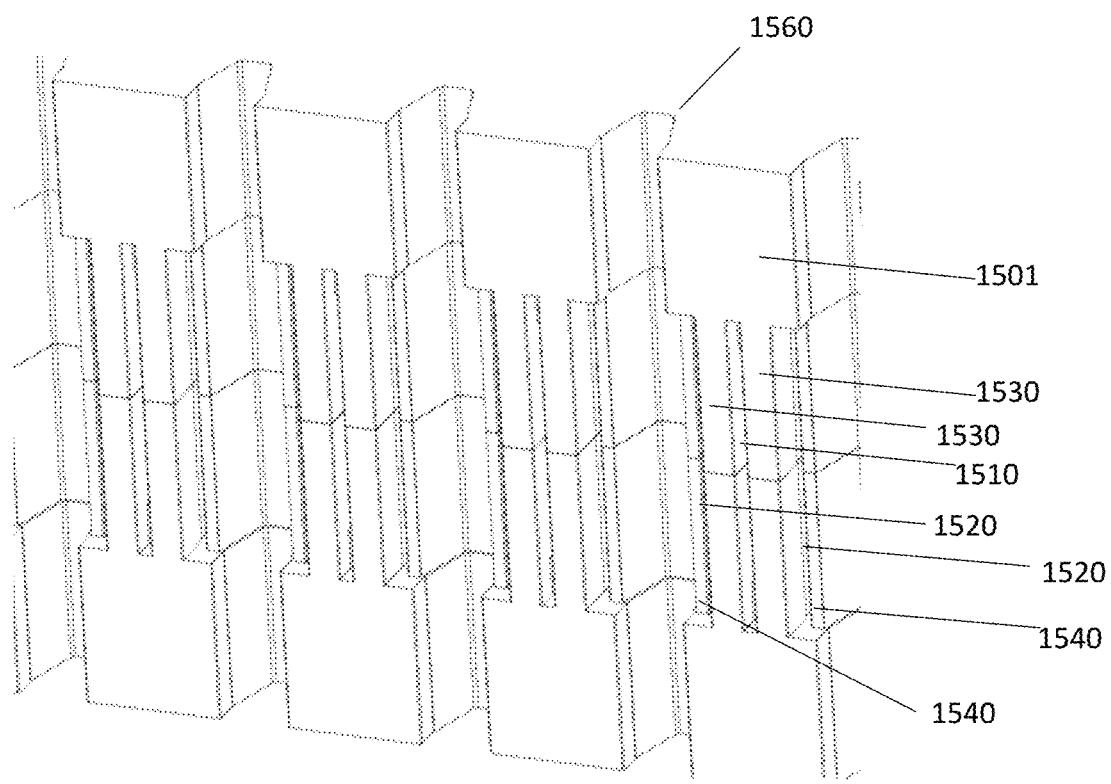
FIG. 16B shows an example of a DEC depositor with dams between delivery apertures and exhaust apertures as disclosed herein.

FIGS. 16A and 16B show enlarged views of depositors as disclosed herein. FIG. 16A shows a conventional DEC depositor in which DE spacers do not form dams between the delivery and exhaust apertures. FIG. 16B shows a simplified view of a DEC depositor that includes dams between each delivery aperture and associated exhaust aperture(s) as disclosed herein, for example as shown in FIGS. 11A-11B and 15A-15D and as described with reference to FIGS. 11A-15D inclusive. The depositor includes a nozzle block as shown, which may be defined based upon its bottom surface 1501. As used herein, the "bottom surface" of the depositor refers to the plane defined by the portion of the depositor that is closest to a substrate when the depositor is used to deposit material on the substrate, regardless of the absolute orientation of the depositor and the substrate. For example, the depositor may be positioned below the substrate within a deposition chamber such that it ejects material upward toward the substrate. In such an arrangement, the "bottom" of the depositor still refers to the portion of the depositor closest to the substrate, although other portions of the depositor may be arranged below the "bottom" surface relative to the ambient environment. The depositor includes one or more nozzles, each of which includes a delivery aperture 1510 in the bottom surface of the depositor. Each nozzle also includes an exhaust aperture 1520 disposed on one or more sides of the delivery aperture 1510, most commonly on opposite sides of the delivery aperture 1510.

Each exhaust aperture may be separated from the associated delivery aperture by a portion of the nozzle block that extends downward (i.e., toward the bottom of the nozzle block as defined above) to a plane that is co-planar with the bottom surface of the nozzle block to form a dam 1530 between the delivery aperture and the exhaust aperture. Each exhaust aperture may be further defined by a second portion of the nozzle block 1540, for example a portion opposite the exhaust aperture from the first portion that forms the dam, which portion does not extend to the plane. Examples of dams are also shown in FIG. 11A (1002) and FIG. 15A (1402). Notably, the portion of the nozzle block around the exhaust aperture that form the dam extends farther toward the substrate than other portions of the nozzle block that define the exhaust aperture.

Since each delivery aperture typically has two opposing exhaust apertures arranged on either side of the delivery aperture, the delivery aperture may have a dam on either side. The dams may be different widths, i.e., there may be a different amount of nozzle block material between the delivery aperture and each of two or more exhaust apertures, when measured along the shortest distance between the adjacent apertures or from one exhaust aperture to the other along a line that crosses the delivery aperture. Dam widths for embodiments disclosed herein may be, for example, 10-100 µm, more preferably 25-50 µm, or any intermediate width. In some embodiments, one dam may have a width that is 2 to 5 times the width of the other dam. Each dam may extend a distance s as previously disclosed away from the same level as the other portion of the nozzle block that forms the exhaust aperture. In various embodiments, s may take any value previously disclosed, such as 10-40 µm. During operation of the depositor, the dams may impede fluid communication between the delivery aperture and the associated exhaust apertures, as previously disclosed herein.

A similar structure may be used for each delivery/exhaust aperture arrangement.

A nozzle block including dams as shown in FIG. 16B may include any of the features previously illustrated and disclosed herein. For example, delivery, exhaust, and/or confinement channels through the nozzle block may end in the associated delivery, exhaust, or confinement apertures in the nozzle block. As another example, the delivery channel may include a fillet, such as shown at 1407 in FIG. 15B. As another example, the nozzle block may include one or more cross-flow channels 1560 arranged between adjacent nozzles, such as those described with respect to channels 1405 in FIG. 15B.

As previously disclosed and as illustrated by the various gas flow diagrams presented herein, during operation of a depositor as shown in FIG. 16B, material ejected from a delivery aperture 1510 that is not deposited on a substrate, and/or carrier gas that is used to entrain such material, may be removed essentially exclusively via the surrounding exhaust apertures 1520. That is, a sufficient amount of the carrier gas and/or un-deposited organic material may be removed via the exhaust apertures that the excess material has no effect or negligible effect on the deposition of material on the substrate. Similarly, during operation of the nozzle block, gas ejected by confinement apertures or other confinement gas flows may be removed by the associated exhaust aperture disposed between the confinement aperture and the central delivery aperture, as previously disclosed and shown in the gas flow examples presented herein.

To operate the depositor shown in FIG. 16B and other embodiments of a DEC depositor having impeding dams as disclosed herein, a carrier gas and an organic vapor may be ejected from each delivery aperture in a nozzle block such as shown in FIG. 16B toward a desired substrate. During this deposition, gas may be removed from the region between the nozzle block and the substrate via one or more exhaust apertures disposed adjacent to and, more preferably, on either side of, the delivery aperture, where portions of the nozzle block disposed between the delivery aperture and the associated exhaust aperture(s) extend to a plane that is co-planar with the bottom surface to form an associated dam between the delivery aperture and the exhaust aperture, as previously disclosed herein. The dams impede fluid communication between the delivery aperture and the exhaust apertures, so as to provide self-regulating deposition as disclosed herein. The material may be ejected from the delivery aperture at a constant pressure, and/or material may be removed from the associated exhaust apertures at a constant flow rate, as previously shown and described herein. It may be preferred for the ratio of the volume of material ejected from the delivery aperture, to the volume of material removed via the associated exhaust apertures, to be between 2 to 1 and 4 to 1 when the nozzle block is positioned at a distance of about 10 to 20 µm from the substrate, measured to the bottom of the nozzle block. That is, in some cases the flow rate of material through the exhaust apertures may be, for example, 2 to 4 times the flow rate of material ejected through the delivery aperture. The average clearance between the substrate and the bottom of the nozzle block may be maintained within a desired range during operation of the device. For example, the height may be maintained at about 10-20 µm. In some embodiments, it may be preferred to maintain an average fly height of 10 µm and/or a local fly height of 5-15 µm during operation of the nozzle block. Notably, embodiments disclosed herein allow for much closer operation to the substrate than prior DEC-type depositors, typically allowing for the distance between the substrate and the nozzle block to be about ⅓ to ½ the distance achievable with conventional DEC-type systems.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A system comprising:
   at least one carrier gas source;
   at least one heated container that includes organic material;
   a jet array print head that includes a plurality of jetting apertures to print lines on a substrate, and that is connected to a vacuum source, wherein the jet array print head includes a gas manifold with an embedded heater that is coupled to a heated injection block;
   a plurality of gas lines that are communicatively coupled the at least one carrier gas source, the at least one heated container, and the jet array print head, wherein the carrier gas transmits the organic material through the gas lines to the jet array print head that contains the plurality of jetting apertures; and
   a pair of gas bearing plates, including a top gas bearing plate and a bottom gas bearing plate, each having a plurality of pressure apertures and a plurality of vacuum apertures, wherein the top gas bearing plate applies a uniform force to a top surface of the substrate and the bottom gas bearing plate applies a uniform force to a bottom surface of the substrate, wherein the top gas bearing plate includes a slot configured for the print head to fit within, and wherein the plurality of vacuum apertures of the pair of gas bearing plates are arranged perpendicular to a direction of travel of the substrate.

2. The system of claim 1, wherein the plurality of pressure apertures of the pair of gas bearing plates are arranged in a pattern that is 45 degree from the plurality of vacuum apertures.

3. The system of claim 1, wherein the pair of gas bearing plates are comprised of at least one selected from the group consisting of: metal, ceramic, and silicon carbide.

4. The system of claim 1, wherein the plurality of pressure apertures and the plurality of exhaust apertures are arranged on the pair of gas bearing plates in an alternating pattern that runs parallel to at least one edge of each of the pair of gas bearing plates.

5. The system of claim 1, wherein a width of the slot is at least one selected from the group consisting of: 25 mm or less, 20 mm or less, 15 mm of less, 10 mm or less, 8 mm or less, and 5 mm or less.

6. The system of claim 1, wherein a flatness of the substrate disposed between the top gas bearing plate and the bottom gas bearing plate is at least one selected from the group consisting of: less than 10 μm, less than 5 μm, less than 2 μm, and less than 1 μm.

7. The system of claim 1, wherein the jet array print head comprises:
a print die.

8. The system of claim 7, wherein the injection block is coupled to a device to control a gap between the jet array print head and the substrate.

9. The system of claim 7, wherein the injection block includes an interface to a gas and vacuum distribution network.

10. The system of claim 7, further comprising at least one selected from the group consisting of: (i) insulation disposed on outer surfaces of the gas manifold and the embedded heater, and (ii) an active cooling device configured to cool a volume surrounding the heated gas manifold.

11. The system of claim 1, wherein a first spacing distance between each of the plurality of vacuum apertures of the pair of gas bearing plates is the same as a second spacing distance between each of the plurality of pressure apertures of the pair of gas bearing plates.

12. The system of claim 11, wherein the first spacing between the plurality of vacuum apertures or the second spacing of the plurality of pressure apertures in the pair of gas bearing plates is selected from at least one of the group consisting of: 25 mm or less, 20 mm or less, 15 mm or less, 10 mm or less, 8 mm or less, 6 mm or less, 5 mm or less, 4 mm or less, 3 mm or less, 2 mm or less, and 1 mm or less.

13. The system of claim 1, wherein the print head is an organic vapor jet printing (OVJP) print head.

* * * * *